United States Patent [19]
Kuriyama

[11] Patent Number: 5,596,212
[45] Date of Patent: Jan. 21, 1997

[54] SEMICONDUCTOR MEMORY DEVICE AND A MANUFACTURING METHOD OF THE SAME

[75] Inventor: Hirotada Kuriyama, Hyogo, Japan

[73] Assignee: Mitsubishi Denki Kabushiki Kaisha, Tokyo, Japan

[21] Appl. No.: 505,804

[22] Filed: Jul. 21, 1995

Related U.S. Application Data

[63] Continuation of Ser. No. 317,424, Oct. 4, 1994, abandoned, which is a continuation of Ser. No. 98,923, Jul. 29, 1993, abandoned.

[30] Foreign Application Priority Data

Sep. 4, 1992 [JP] Japan .................................. 4-237249
Mar. 18, 1993 [JP] Japan .................................. 5-058764

[51] Int. Cl.$^6$ .................... H01L 27/108; H01L 29/76; H01L 29/94; H01L 31/119
[52] U.S. Cl. ........................... 257/298; 257/904; 257/903
[58] Field of Search .................................. 257/903, 904, 257/298

[56] References Cited

U.S. PATENT DOCUMENTS 4,744,056 5/1988 Yu et al. .

FOREIGN PATENT DOCUMENTS

| | | | |
|---|---|---|---|
| 0441379 | 8/1991 | European Pat. Off. ............... | 257/903 |
| 62-245661 | 10/1987 | Japan . | |
| 63-291461 | 11/1988 | Japan . | |
| 2-122522 | 5/1990 | Japan . | |
| 3-34569 | 2/1991 | Japan . | |
| 4-3976 | 1/1992 | Japan . | |
| 2049276 | 12/1980 | United Kingdom ................... | 257/903 |

OTHER PUBLICATIONS

Proceedings of the Symposium on VLSI Technology, OISO, Japan, May 28–30, 1991, No. SYMP. 11, 28 May 1991 Institute of Electrical and Electronics Engineers, pp. 25–26, XP 000260004, Uemoto Y et al., '1.5 V Supply Voltage, Low Standby current SRAMS', Fig. 1.

T. Yamanaka et al., "A 5.9 μm$^2$Super Low Power SRAM Cell Using a New Phase–Shift Lithography", International Electron Devices Meeting, 1990, pp. 477–480.

Kazuo Itabashi et al., "A Split Wordline Cell for 16Mb SRAM Using Polysilicon Sidewall Contacts", International Electron Devices Meeting, 1991, pp. 477–480.

H. Ohkubo et al., "16 Mbit SRAM Cell Technologies for 2.0 V Operation", International Electron Devices Meeting, 1991, pp. 481–484.

*Primary Examiner*—Stephen Meier
*Attorney, Agent, or Firm*—Lowe, Price, LeBlanc & Becker

[57] ABSTRACT

A memory cell of an SRAM prevents imbalance between GND potentials of a pair of driver transistors. In the memory cell, the driver transistors $Q_1$ and $Q_2$ in a pair have the common source region.

7 Claims, 22 Drawing Sheets

SEMICONDUCTOR MEMORY DEVICE AND A MANUFACTURING METHOD OF THE SAME

This application is a continuation of application Ser. No. 08/317,424 filed Oct. 4, 1994 now abandoned, which is a continuation of application Ser. No. 08/098,923 filed Jul. 29, 1993 now abandoned.

BACKGROUND OF THE INVENTION

1. Field of the Invention

The present invention relates to a semiconductor memory device and a manufacturing method of the same, and in particular, to a structure of a memory cell of an SRAM (Static Random Access Memory) and a manufacturing method of the same.

2. Description of the Background Art

SRAMs are one type of known semiconductor memory devices. FIG. 25 is an equivalent circuit diagram showing one memory cell of a conventional SRAM. This memory cell is formed of six transistors including P-type MOS transistors as a load. Specifically, a pair of driver transistors $Q_1$ and $Q_2$ (N-type MOS transistors) and a pair of load transistors $Q_5$ and $Q_6$ (P-type MOS transistors) are mutually connected to form a flip-flop circuit. A pair of the load transistors $Q_5$ and $Q_6$ have source regions 110 and 111 connected to a $V_{cc}$ power supply. The driver transistors $Q_1$ and $Q_2$ have source regions connected to GNDs 112 and 113, respectively. A pair of access transistors $Q_3$ and $Q_4$ (N-type MOS transistors) are connected to memory nodes 114 and 115, respectively. A bit line 107 is connected to one of source/drain regions of the access transistor $Q_3$. A bit line 108 is connected to one of source/drain regions of the access transistor $Q_4$. Gate electrodes of the access transistors $Q_3$ and $Q_4$ are connected to a word line 109.

FIGS. 26–28 are plans of a memory cell of the SRAM, and show structures of lower, middle and upper layers on and above a surface of a substrate, respectively. FIG. 29 is a cross section taken along line 29—29 in FIGS. 26–28. Referring to FIGS. 25–29, the conventional memory cell includes a silicon substrate 148 having a main surface, on which a pair of the driver transistors $Q_1$ and $Q_2$ as well as a pair of the access transistors $Q_3$ and $Q_4$ are formed. The driver transistor $Q_1$ has a drain region 121, a source region 122 and a gate electrode 125. The driver transistor $Q_2$ has a drain region 117, a source region 118 and a gate electrode 126.

The access transistor $Q_3$ has a pair of source/drain regions 119 and 120 as well as a gate electrode 109. The access transistor $Q_4$ has a pair of source/drain regions 116 and 117 as well as a gate electrode 109.

These transistors are formed of N-type MOS transistors having source/drain regions which are formed in the main surface of the P-type silicon substrate 148. The gate electrode 126 of the driver transistor $Q_2$ is connected to the source/drain region 120 of the access transistor $Q_3$ through a contact portion 128. The gate electrode 126 of the driver transistor $Q_2$ is connected to the drain region 121 of the driver transistor $Q_1$ through a contact portion 129. The gate electrode 125 of the driver transistor $Q_1$ is connected to the source/drain region 117 of the access transistor $Q_4$ and the drain region 117 of the driver transistor $Q_2$ through a contact portion 127.

A gate electrode 130 of the load transistor $Q_5$ is connected through a contact portion 139 to a source/drain region 137 of the load transistor $Q_6$. A gate electrode 131 of the load transistor $Q_6$ is connected through a contact portion 138 to source/drain region 134 of the load transistor $Q_5$.

The bit line 107 is connected through a contact portion 146 to the source/drain region 119 of the access transistor $Q_3$. The bit line 108 is connected through a contact portion 147 to the source/drain region 116 of the access transistor $Q_4$.

As described above, the memory cell of the SRAM in the prior art includes the four N-type MOS transistors disposed on the silicon substrate, and the thin-film transistor of P-type disposed in the upper layer and used as a load. FIG. 30 is a cross section showing a typical example of a thin-film transistor which can be used as the load transistors $Q_5$ and $Q_6$. Referring to FIG. 30, the thin-film transistor includes a semiconductor layer, e.g., of polysilicon, in which a channel region 142 and a pair of source/drain regions 141 and 143 are formed. A gate electrode 140 is disposed at a position opposed to the channel region 142 with an insulating layer therebetween. FIG. 31 shows a current characteristic of the foregoing thin-film transistor. In this figure, "Vd" represents a drain voltage, "Vg" represents a gate voltage, and "Id" represents a drain current.

FIG. 32 is an equivalent circuit diagram showing a read operation of the memory cell of the SRAM. Referring to FIG. 32, the load transistors $Q_5$ and $Q_6$ shown in FIG. 25 are not shown in this equivalent circuit diagram because the current flowing therethrough is sufficiently small. The bit lines 107 and 108 are connected to bit line loads 160 and 161 formed of P-type MOS transistors.

It is assumed that a memory node A is at L level, and a memory node B is at H level. In the read operation, the current i flows from the bit line load 160 through the memory node A at the L level to the GND 112. Meanwhile, in connection with the memory node B at the H level, the current does not flow from the bit line load 161 to the GND 113.

As shown in FIG. 26, the source region 122 of the driver transistor $Q_1$ and the source region 118 of the driver transistor $Q_2$ are formed at different regions. Parasitic resistances r are formed between the source region 118 and GND 113 and between the source region 122 and GND 112. In the state shown in FIG. 32, therefore, the potential of a node C increases by r×i. Meanwhile, the current does not flow through a node D, so that the potential of the node D does not increase. Therefore, the potentials of the nodes C and D in one memory cell become unbalanced, and thus the correct read operation cannot be executed. In other words, when the potential of the node C increases, the potential of the memory node A also increases, resulting in a disadvantage that the potential of the memory node A changes from the L level to the H level, and the potential of the memory node B changes from the H level to the L level. In this case, erroneous data is read in the data read operation.

The following disadvantage is also caused. FIG. 33 is a cross section of a structure in which the first direct contact portions 127, 128 and 129 shown in FIGS. 26 and 29 have shared direct contact structures. The shared contact structures shown in FIG. 33 have been frequently used in the prior art. Specifically, the gate electrode 126 of the driver transistor $Q_2$ is formed on an element isolating oxide film 124 with a gate oxide film 162 therebetween. An interlayer insulating film 164 is formed on the silicon substrates 148 and the gate electrode 126. A contact hole 164a is formed in the layer insulating film 164 located between the gate electrode 126 and the drain region 121 of the driver transistor $Q_1$. The gate electrode 126 and the drain region 121 are electrically connected to each other in the contact hole by a second polysilicon layer 165. Although the shared direct contact portion 163 is formed in this manner, a following disadvantage occurs if a position of the end portion of the gate electrode 126 deviates. FIG. 34 is a cross section showing the disadvantage caused by the deviation of the end portion of the gate electrode 126 of the driver transistor $Q_2$. As shown in FIG. 34, if the end portion of the gate electrode 126 is located above the element isolating oxide film 124, the end portion of the element isolating oxide film 124 is shaved due to an etching process for forming the contact hole 164a. This results in a disadvantage that a leak current $i_0$ is generated at a position where the element isolating oxide film 124 is shaved.

Further, the following disadvantage is caused. FIG. 35 is an enlarged fragmentary cross section of the load transistor $Q_6$ shown in FIG. 29. Referring to FIG. 35, the potential of the bit line 107 changes in an actual operation. Therefore, the bit line 107 acts as a gate electrode of the load transistor $Q_6$, resulting in malfunction of the load transistor $Q_6$. This phenomenon has been referred to as a crosstalk phenomenon.

SUMMARY OF THE INVENTION

It is an one object of the invention to provide a semiconductor memory device, in which imbalance between GND potentials of a pair of driver transistors is suppressed.

It is another object of the invention to provide a semiconductor memory device, in which connection between a gate electrode of a driver transistor and an impurity region is achieved by a shared direct contact structure, and a junction leak current is reduced.

It is still another object of the invention to provide a semiconductor memory device, in which a resistance of a source region of a driver transistor is effectively reduced.

It is yet another object of the invention to provide a manufacturing method of a semiconductor memory device for easily manufacturing a semiconductor memory, in which a resistance of a source region of a driver transistor can be effectively reduced.

A semiconductor memory device according to one aspect of the invention includes a memory cell provided with a pair of first and second driver transistors of a first conductivity type, and a pair of first and second load transistors of a second conductivity type, which form a flip-flop circuit, as well as a pair of first and second access transistors. The memory cell includes a gate electrode of the first driver transistor, a gate electrode of the second driver transistor, which extends substantially in the same direction as the gate electrode of the first driver transistor with a predetermined space therebetween, and one word line which extends substantially in the same direction as the gate electrode of the first driver transistor with a predetermined space therebetween, and forms gate electrodes of the first and second access transistors. Source regions of the first and second driver transistors, which are electrically connected together, are formed between the gate electrodes of the first and second driver transistors. A low resistance layer may be formed on the source regions of the first and second driver transistors. The first and second load transistors may include first and second thin-film transistors formed on an interlayer insulating film located over the semiconductor substrate, the first and second access transistors may be connected to first and second bit lines extending above the first and second thin-film transistors thereof, respectively, and the source regions of the first and second driver transistors may be electrically connected to a ground interconnection layer having an upper portion which extends between the first and second thin-film transistors and the first and second bit lines.

If the above-described memory cell is formed in a rectangular region formed of first sides and second sides shorter than the first side, a bit line and a ground interconnection layer may be formed a prescribed distance apart from each other and extending in the direction along the second side over the rectangular region.

In operation, since the source regions of the first and second driver transistors, which are electrically connected together, are formed between the gate electrodes of the first and second driver transistors, the first driver transistor has a GND potential equal to a GND potential of the second driver transistor, which overcomes imbalance between the GND potentials of the first and second driver transistors. In the structure in which the low resistance layer is formed on the source regions of the first and second driver transistors, parasitic resistances of the source regions decrease, so that increase of the GND potential, which may be caused by a current flowing through the parasitic resistances, can be effectively prevented. In the structure in which the source regions of the first and second driver transistors are electrically connected to the ground interconnection layer having the upper portion, which extends between the first and second bit lines and the first and second thin-film transistors forming the first and second load transistors, the ground interconnection layer effectively prevents malfunction of the first and second thin-film transistors, which may be caused by fluctuation of the potentials of the first and second bit lines.

If a bit line and a metal interconnection layer to be a ground interconnection layer are formed a prescribed distance apart from each other and extending in the direction along the second side (shorter side) of a rectangular region over the rectangular region in which a memory cell is formed, the metal interconnection layer to be the ground interconnection having small resistance can directly be connected to a common source region of a first driver transistor and a second driver transistor, and therefore the resistance of the entire ground interconnection layer is reduced as compared to a conventional case in which the metal interconnection layer to be the ground interconnection layer is connected to the source region of the first or second driver transistor through a polysilicon layer having larger resistance than the metal interconnection layer. Therefore, the potential increase of the ground interconnection layer can effectively be prevented.

According to another aspect of the invention, a semiconductor memory device includes a semiconductor substrate of a second conductivity type having a main surface, an element isolating and insulating film formed on the main surface of the semiconductor substrate, an impurity region of a first conductivity type adjacent to the element isolating and insulating film and formed on the main surface of the semiconductor substrate, a gate electrode of a first driver transistor formed on the element isolating and insulating film, a first conductive layer which is electrically connected to the impurity region and extends on the gate electrode of the first driver transistor with an insulating film therebetween, and a second conductive layer which is formed on the first conductive layer and the gate electrode and connects the first conductive layer and the gate electrode to each other.

In operation, the first conductive layer is electrically connected to the impurity region adjacent to the element isolating and insulating film, and extends on the gate electrode of the first driver transistor, which is located on the element isolating and insulating film, with the insulating film therebetween. The second conductive layer, which connects the first conductive layer and the gate electrode, is formed on the first conductive layer and the gate electrode. Therefore, the shaving of the element isolating and insulating film, which may be caused in the prior art, does not occur during the formation of the contact hole for connecting the first conductive layer and the impurity layer.

A semiconductor memory device in another aspect of the invention includes a memory cell provided with a pair of first and second driver transistors of first type conductivity constituting a flip-flop circuit, a pair of first and second load transistors of second type conductivity, and a pair of first and second access transistors. The semiconductor memory device includes word lines forming the gate electrodes of first and second access transistors and extending in a prescribed direction, and a power supply voltage interconnection layer formed to extend in a direction substantially perpendicular to the direction in which the word lines extend.

Since the power supply voltage interconnection layer is formed to extend in the direction substantially perpendicular to the direction in which the word lines extend, it is not necessary to charge a large number of memory cells at a time but a small number of memory cells need only be charged. Thus, a sub interconnection layer necessary for charging a large number of memory cells at a time according to a conventional technique will not be necessary. Accordingly, a connection region for the sub interconnection layer and the power supply voltage interconnection layer, etc. will not be necessary.

A manufacturing method of one aspect of the invention includes the steps of forming gate electrodes of first and second driver transistors on a main surface of a semiconductor substrate with a predetermined space between each other, forming a source region, which is common to the first and second driver transistors, between the gate electrodes of the first and second driver transistors, forming an insulating film, which has an opening located above the source region and covers the semiconductor substrate and the gate electrodes of the first and second driver transistors, and forming a metal silicide layer on a surface of the source region located inside the opening.

In operation, the source region common to the first and second driver transistors is formed between the gate electrodes of the first and second driver transistors, and thereafter, the insulating film, which covers the semiconductor substrate and the gate electrodes of the first and second driver transistors and has the opening located above the source region, is formed. The metal silicide layer is formed on the surface of the source region located inside the opening in the insulating film. Therefore, the metal silicide layer reduces the resistance of the source region.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 5:
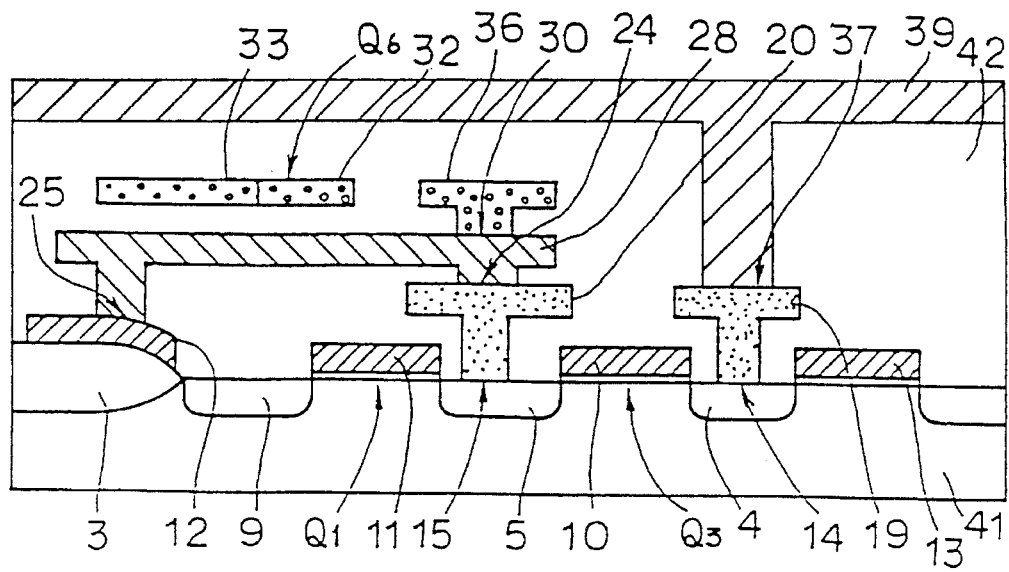
FIG. 5 is a cross section of a memory cell of a first embodiment taken along line 5—5 in FIGS. 1–4.
Figure 6:
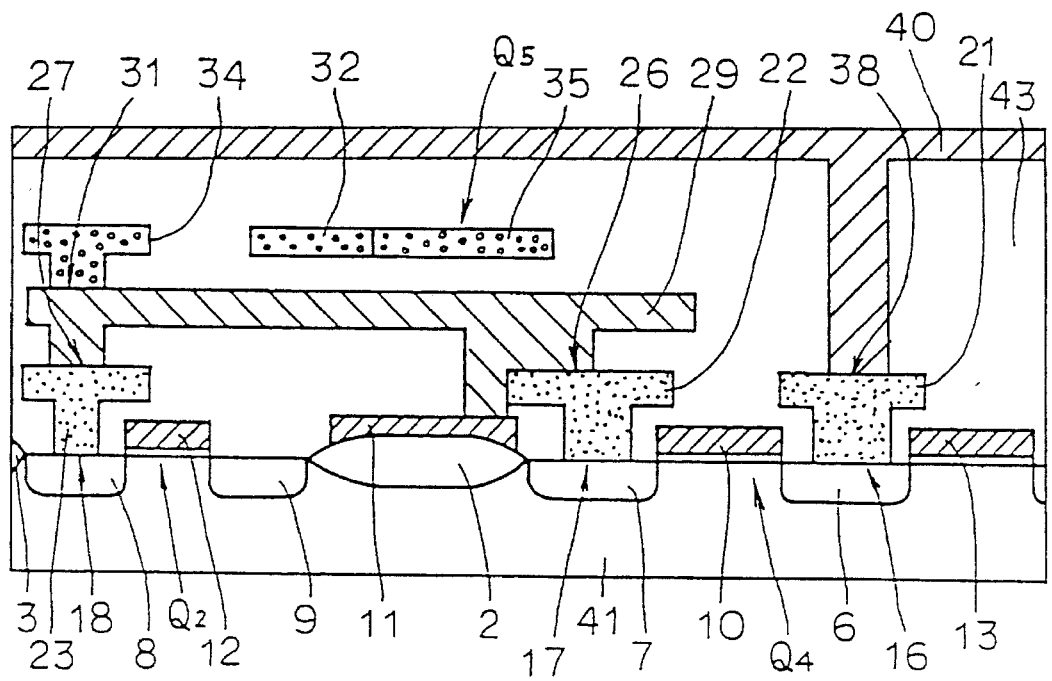
FIG. 6 is a cross section of a memory cell of a first embodiment taken along line 6—6 in FIGS. 1–4.

FIGS. 1–4 are plans showing a memory cell of an SRAM of a first embodiment of the invention. Specifically, FIGS. 1–4 are plans showing a lower layer on a surface of a substrate and higher layers at three different levels, respectively. FIG. 5 is a cross section taken along line 5—5 in FIGS. 1–4. FIG. 6 is a cross section taken along line 6—6 in FIGS. 1–4.

Figure 1:
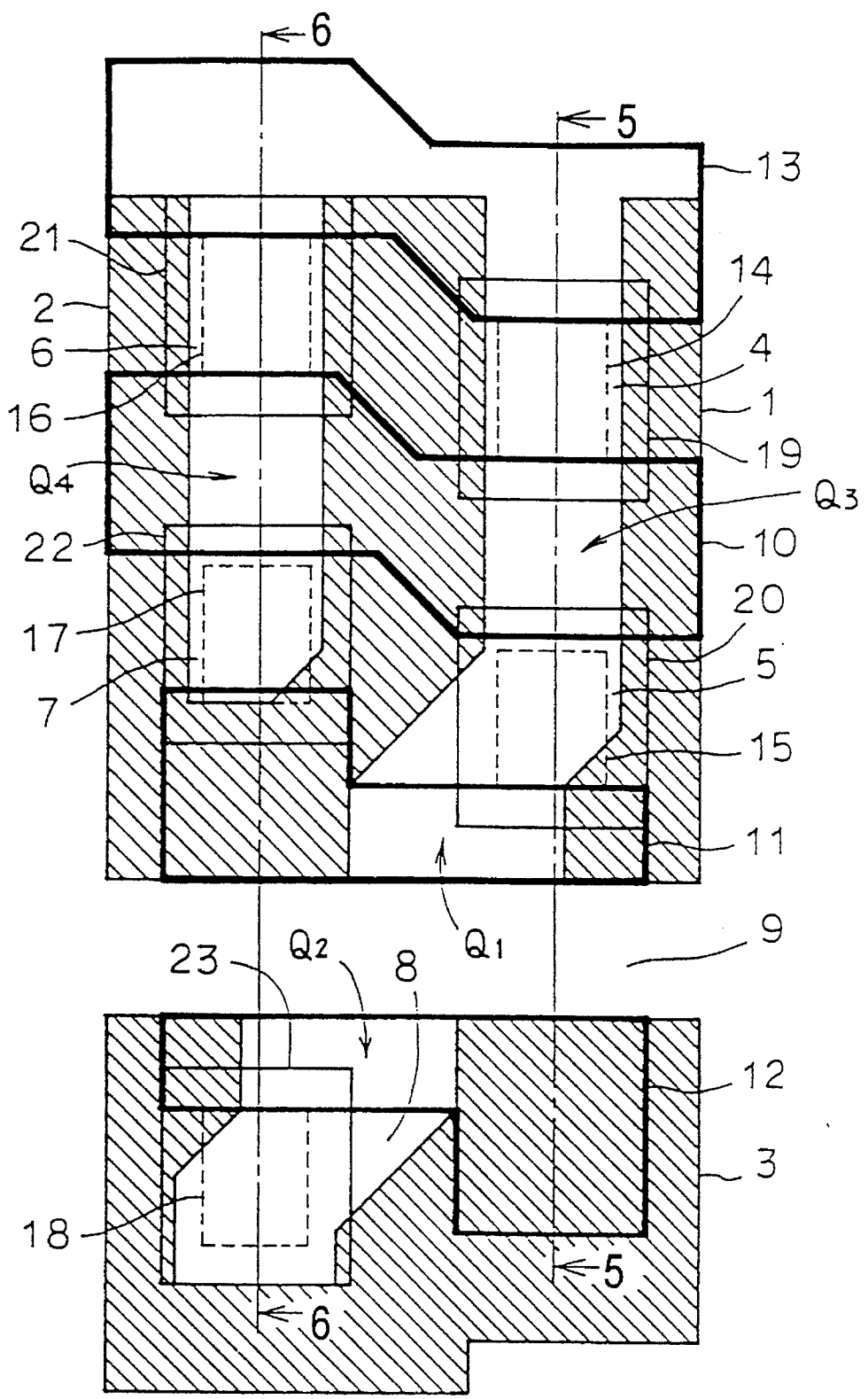
FIG. 1 is a plan showing a structure at a first level of a memory cell of an SRAM according to a first embodiment of the invention.

In FIG. 1, there are shown impurity regions (source/drain regions) 4–9 of an N-type, element isolating oxide films 1–3, first polysilicon layers 10–13, first direct contact portions 14–18 and second polysilicon layers 19–23.

A driver transistor $Q_1$ is formed of the gate electrode (first polysilicon layer) 11 extending in a predetermined direction, as well as the source region 9 and the drain region 5 which are of the N-type and are formed in a direction perpendicular to the gate electrode 11 with a predetermined space between each other. A driver transistor $Q_2$ is formed of the gate electrode 12, which extends substantially in the same direction as the gate electrode 11 of the driver transistor $Q_1$ with a predetermined space therebetween, as well as the source region 9 and the drain region 8 which are of the N-type and are formed substantially perpendicularly to the gate electrode 12 with a predetermined space between each other. Thus, the driver transistors $Q_1$ and $Q_2$ have the common source region 9. An access transistor $Q_3$ is formed of a pair of the source/drain regions 4 and 5 of the N-type and the gate electrode (word line) 10. An access transistor $Q_4$ is formed of a pair N-type source/drain regions 6 and 7 and the gate electrode (word line) 10. Thus, the access transistors $Q_3$ and $Q_4$ have the common gate electrode (word line) 10. The word line 10 extends substantially in the same direction as the gate electrode of the driver transistor $Q_1$ with a predetermined space therebetween. First direct contact portions 14–18 connect the impurity regions 4–8 of the N-type to second polysilicon layers 19–23, respectively. The first polysilicon layer 13 forms a gate electrode of an access transistor of a neighboring different memory cell.

Figure 2:
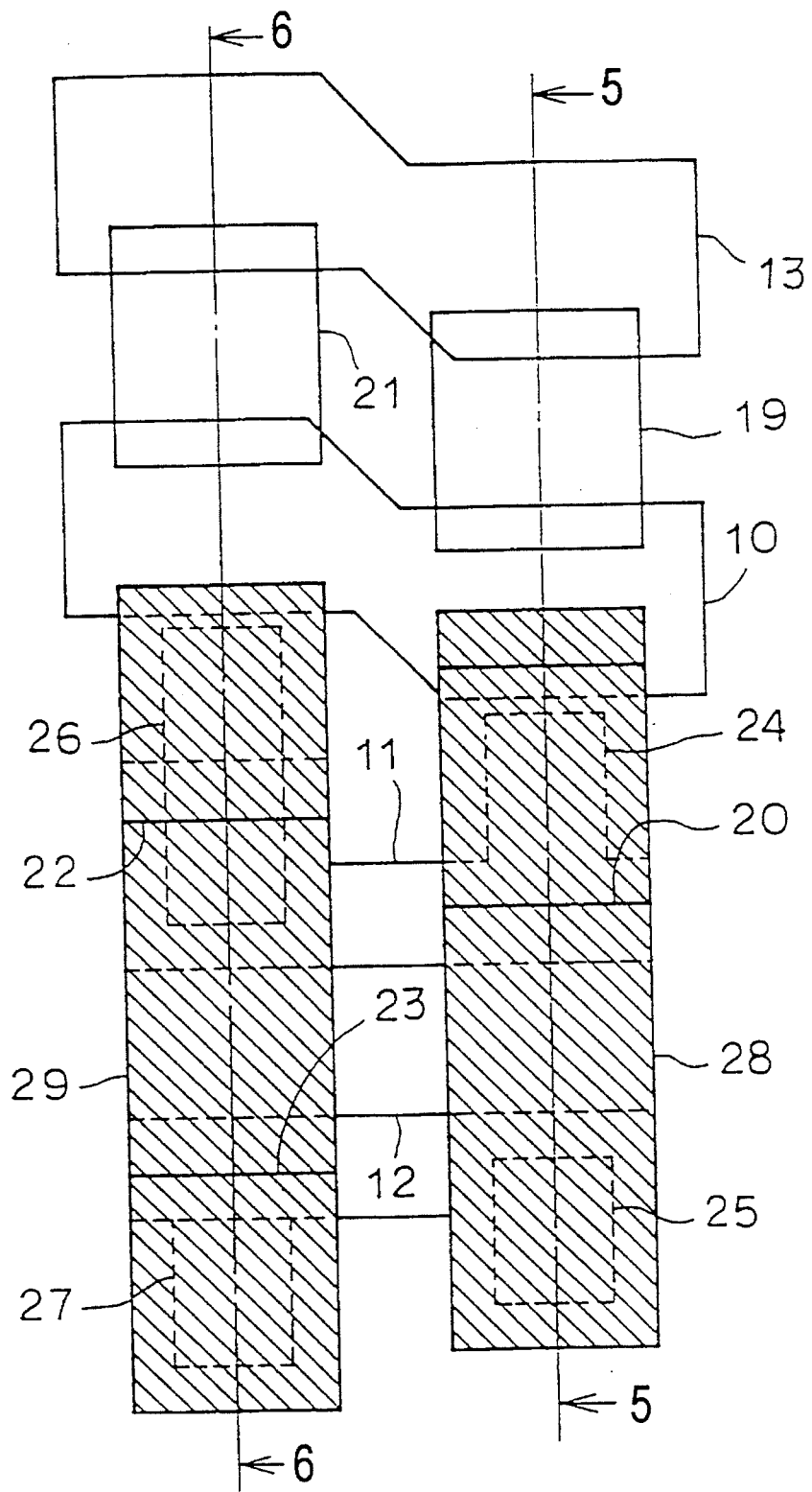
FIGS. 2–4 are plans showing structures at second to fourth levels of a memory cell of an SRAM according to a first embodiment of the invention, respectively.

In FIG. 2, there are shown the first polysilicon layers 10–13, second polysilicon layers 19–23, second direct contact portions 24–27 and third polysilicon layers 28–29. The second direct contact portions 24–27 connect the third polysilicon layers 28–29 to the second polysilicon layers 20, 22 and 23 or to the first polysilicon layers 11. The third polysilicon layers 28 and 29 form gate electrodes of load transistors $Q_6$ and $Q_5$, respectively, which will be described later.

Figure 3:
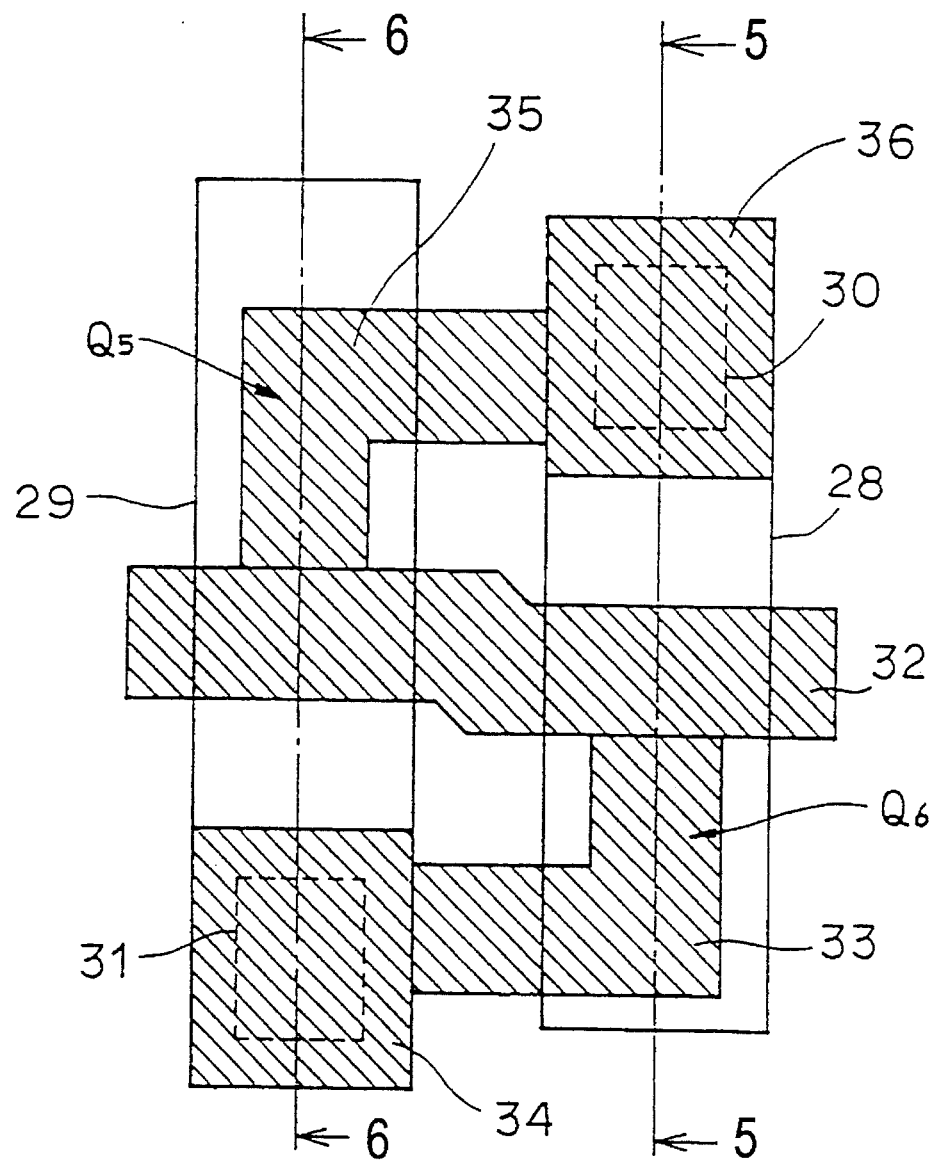

In FIG. 3, there are shown the third polysilicon layers 28 and 29, fourth polysilicon layers 32–36 and third direct contact portions 30 and 31. The third direct contact portions 30 and 31 connect the fourth polysilicon layers 32–36 to the third polysilicon layers 28 and 29. The load transistor $Q_5$ is formed of the P-type source/drain regions (fourth polysilicon layers) 32 and 36, the channel region (fourth polysilicon layer) 35 and the gate electrode (third polysilicon layer) 29.

The load transistor $Q_6$ is formed of the P-type source/drain regions (fourth polysilicon layers) 32 and 34, the channel region (fourth polysilicon layer) 33, and the gate electrode (third polysilicon layer) 28.

Figure 4:
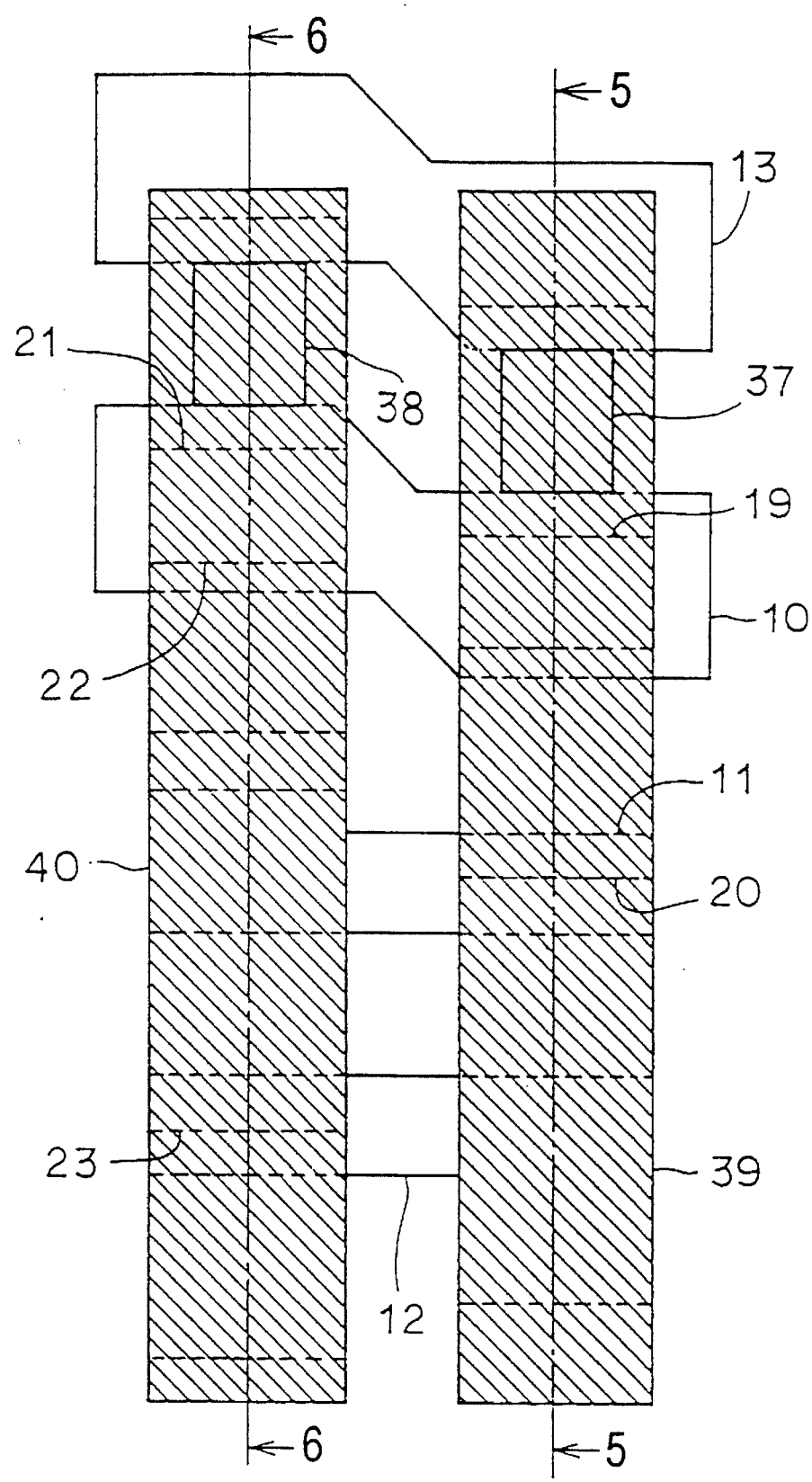

In FIG. 4, there are shown the first polysilicon layers 10–13, second polysilicon layers 19–23, contact portions 37–38 and bit lines 39–40 formed of metal interconnection, e.g., made from aluminum or tungsten. The contact portions 37 and 38 connect the bit lines 39 and 40 to the second polysilicon layers 19–23.

Referring to FIGS. 5 and 6, sectional structures of the memory cell of the first embodiment will be described below. Referring to FIG. 5, the gate electrodes 10, 11, 12 and 13, which extend perpendicularly to the sheet of the figure, are formed on the main surface of the P-type semiconductor substrate (P-well) 39 with predetermined spaces between each other. The element isolating oxide film 3 is formed on the predetermined region of the main surface of the P-type semiconductor substrate 41. The source region 9 is formed between the element isolating oxide film 3 and the gate electrode 11 of the driver transistor $Q_1$. The impurity region 5 of the N-type, which serves as the drain region of the driver transistor $Q_1$ and the source/drain region of the access transistor $Q_3$, is formed between the gate electrode 11 of the driver transistor $Q_1$ and the gate electrode 10 of the access transistor $Q_3$. The source/drain region 4 of the access transistor $Q_3$ is formed between the gate electrode 10 of the access transistor $Q_3$ and the gate electrode 13 of the access transistor of the neighboring memory cell. The pad layers (second polysilicon layers) 20 and 19 are formed on the impurity region 5 and the source/drain region (impurity region) 4, respectively. The pad layer 20 is electrically connected through the first direct contact portion 15 to the impurity region 5. The pad layer 19 is electrically connected through the first direct contact portion 14 to the impurity region 4. The pad layer 20 and the gate electrode 12 of the driver transistor $Q_2$ are electrically connected through the second direct contact portions 24 and 25 by the third polysilicon layer 28. The third polysilicon layer 28 serves as the gate electrode of the load transistor $Q_6$. The fourth polysilicon layer 36 is formed on the third polysilicon layer 28 with the third direct contact portion 30 therebetween. The fourth polysilicon layers 32 and 33 are formed on the third polysilicon layer 28 with an interlayer insulating film 42 therebetween. The fourth polysilicon layer 36 forms the source/drain regions of the load transistor $Q_5$, the fourth polysilicon layer 32 forms the source/drain regions of the load transistors $Q_5$, $Q_6$, and the fourth polysilicon layer 33 forms the channel region of the load transistor $Q_6$. The pad layer 19 is electrically connected through the contact portion 37 to the bit line 39 extending above the load transistor $Q_6$.

Referring to FIG. 6 showing the section taken along line 6—6 in FIGS. 1–4, the gate electrodes 10, 11, 12 and 13 are formed on the main surface of the P-type semiconductor substrate with predetermined spaces between each other. The element isolating oxide film 2 is formed under the gate electrode 11. The drain region 8 of the driver transistor $Q_2$ is formed adjacent to the gate electrode 12 of the driver transistor $Q_2$. The source region 9 of the driver transistor $Q_2$ is formed between the gate electrode 12 and the element separating oxide film 2. The source/drain region 7 of the access transistor $Q_4$ is formed between the element isolating oxide film 2 and the gate electrode 10 of the access transistor $Q_4$. The source/drain region 6 of the access transistor $Q_4$ is formed between the gate electrode 10 of the access transistor $Q_4$ and the gate electrode 13 of the access transistor of the neighboring memory cell. The pad layers (second polysilicon layers) 21, 22 and 23 are formed on the source/drain regions 6 and 7 of the access transistor $Q_4$ and the drain region 8 of the driver transistor $Q_2$ with the first direct contact portions 16, 17 and 18 therebetween, respectively. Pad layer 22 is electrically connected to the gate electrode 11 of the driver transistor $Q_1$ through the third polysilicon layer 29. Thus, in the embodiment, the electrical connection between the gate electrode 11 of the driver transistor $Q_1$ and the source/drain region 7 of the access transistor $Q_4$ is achieved, using the two polysilicon layers, i.e., the pad layer (second polysilicon layer) 22 and the third polysilicon layer 29. The third polysilicon layer 29 is electrically connected also to the pad layer 23 through the second direct contact portion 27. The fourth polysilicon layer 34 is formed on the third polysilicon layer 29 with the third direct contact portion 31 therebetween. The fourth polysilicon layers 32 and 35 are formed on the third polysilicon layer 29 with an interlayer insulating film 43 therebetween. The fourth polysilicon layer 34 form the source/drain regions of the load transistor $Q_6$, and the fourth polysilicon layer 35 forms the channel region of the load transistor $Q_5$. The third polysilicon layer 29 forms the gate electrode of the load transistor $Q_5$. The pad layer 21 is electrically connected to the bit line 40, which extends above the load transistor $Q_5$, through the contact portion 38.

Figure 7:
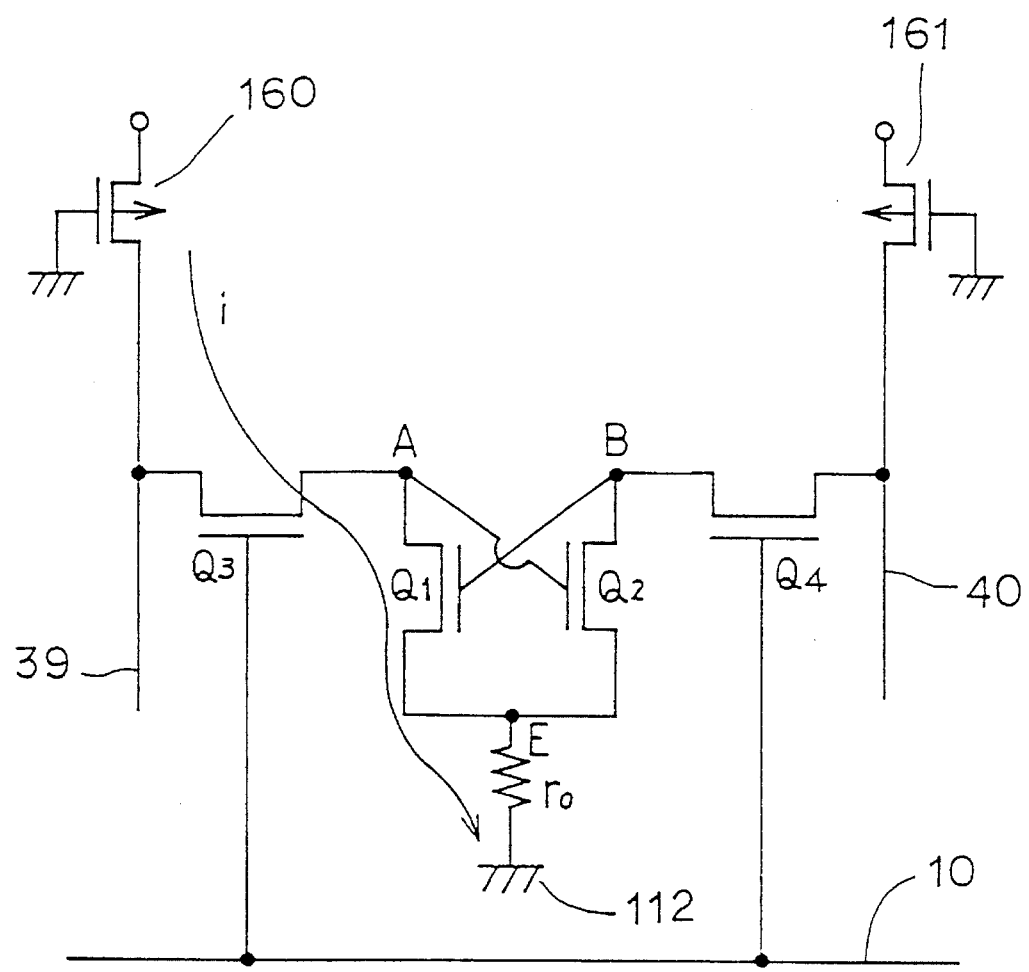
FIG. 7 is an equivalent circuit diagram showing an operation of a memory cell of a first embodiment shown in FIGS. 1–6.

FIG. 7 is an equivalent circuit diagram showing a read operation of the memory cell of the first embodiment shown in FIGS. 1–6. The load transistors $Q_5$ and $Q_6$ are not shown in this equivalent circuit diagram, because the currents flowing therethrough are small. Also in this figure, there are shown bit line loads 160 and 161 which are connected to the bit lines 49 and 40, respectively. It is assumed that a memory node A is at an L level and a memory node B is at a H level. In this case, a current flows from the bit line load 160 through the access transistor $Q_3$, memory node A, driver transistor $Q_1$ and node E to the GND 112. In this first embodiment, the driver transistors $Q_1$ and $Q_2$ have the common source region 9, as shown in FIGS. 1, 5 and 6. Therefore, even if the current flows from the node E toward the GND 112 and the potential of the node E increases by i×$r_0$, the potentials of the memory nodes A and B increase to the same extent, so that the driver transistors $Q_1$ and $Q_2$ have the equal GND potentials. Therefore, imbalance between the GND potentials of the driver transistors $Q_1$ and $Q_2$ is overcome. Consequently, inversion of data, which may be caused by the imbalance between the GND potentials in the prior art, can be effectively prevented.

Figure 34:
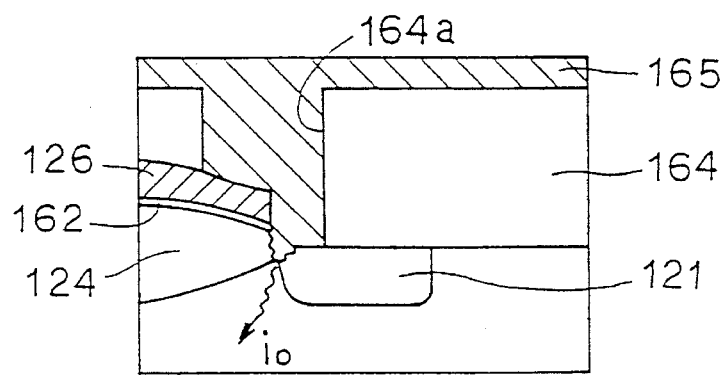
FIG. 34 is a cross section showing a disadvantage of a shared direct contact structure shown in FIG. 33.
Figure 35:
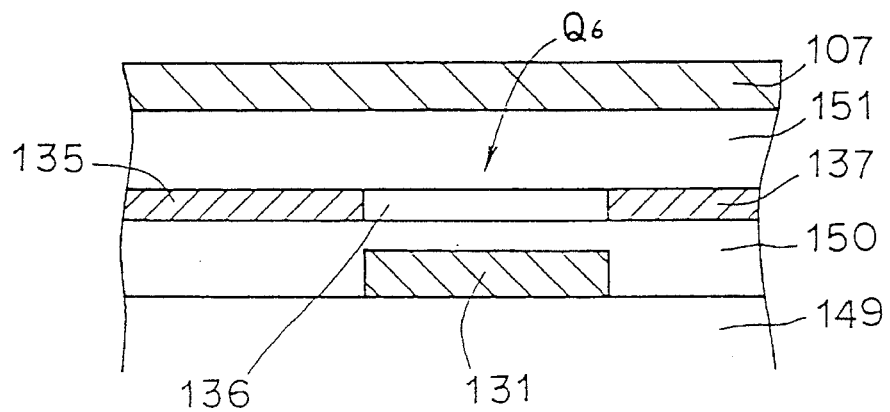
FIG. 35 is a fragmentary enlarged cross section of a load transistor $Q_6$ shown in FIG. 29.

In the memory cell of the first embodiment, as shown in FIG. 6, the electric connection between the gate electrode 11 of the driver transistor $Q_1$ and the source/drain region 7 of the access transistor $Q_4$ is achieved by the two polysilicon layers, i.e., the second and third polysilicon layers 29 and 22, whereby the disadvantage, which occurs in the shared direct contact structure shown in FIG. 34, is overcome. Thus, in the contact structure of the first embodiment shown in FIG. 6, direct contact is not required between the end portion of the gate electrode 11 and the second polysilicon layer 22, so that the first direct contact portion 17 can be formed independently from the position of the end portion of the gate electrode 11. Therefore, even if the deviated end portion of the gate electrode 11 is located above the element separating oxide film 2, it is not necessary to form the first direct contact portion 17 in the region on the element isolating oxide film 2, which has been required in the prior art. Consequently, the element isolating oxide film 2 is not shaved by the etching for forming the first direct contact portion 17, and thus the leak current, which may be generated in the conventional shared direct contact structure shown in FIG. 34, is not generated.

Figure 8:
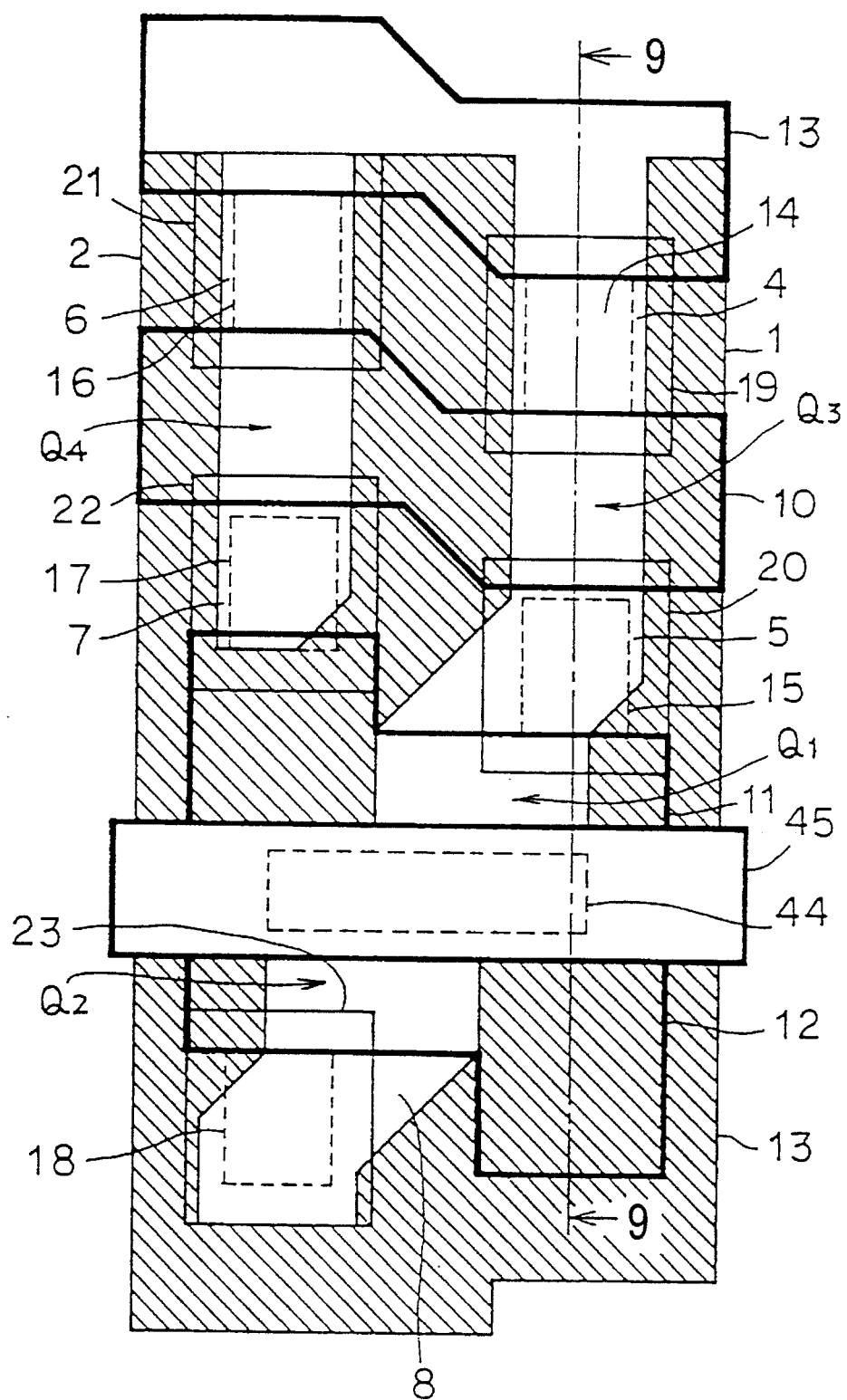
FIG. 8 is a plan showing a memory cell of an SRAM of a second embodiment of the invention.
Figure 9:
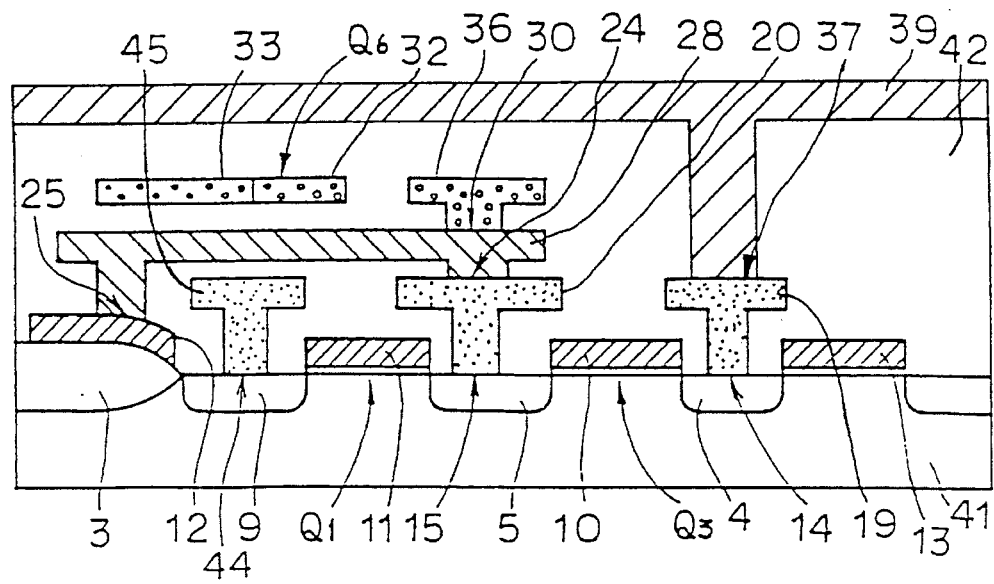
FIG. 9 is a cross section of a memory cell of a second embodiment taken along line 9—9 in FIG. 8.

FIG. 8 is a plan showing a memory cell of an SRAM of a second embodiment of the invention. The plan of FIG. 8 corresponds to the plan of FIG. 1 showing the first embodiment. FIG. 9 is a cross section taken along line 9—9 in FIG. 8. Referring to FIGS. 8 and 9, the memory cell of this second embodiment differs from the memory cell of the first embodiment shown in FIG. 1 in that a second polycide interconnection 45 is formed in the common source region 9 of the driver transistors $Q_1$ and $Q_2$ with a first direct contact portion 44 therebetween. The formation of the second polycide interconnection 45 on the source region 9 achieves the effect that the resistance of the source region 9 can be reduced, in addition to the effect provided by the first embodiment. Thereby, the parasitic resistance $r_0$ shown in FIG. 7 can be reduced, and thus the increase of the potential of the node E, which is caused by the flow of current through the parasitic resistance $r_0$, can be suppressed.

Figure 10:
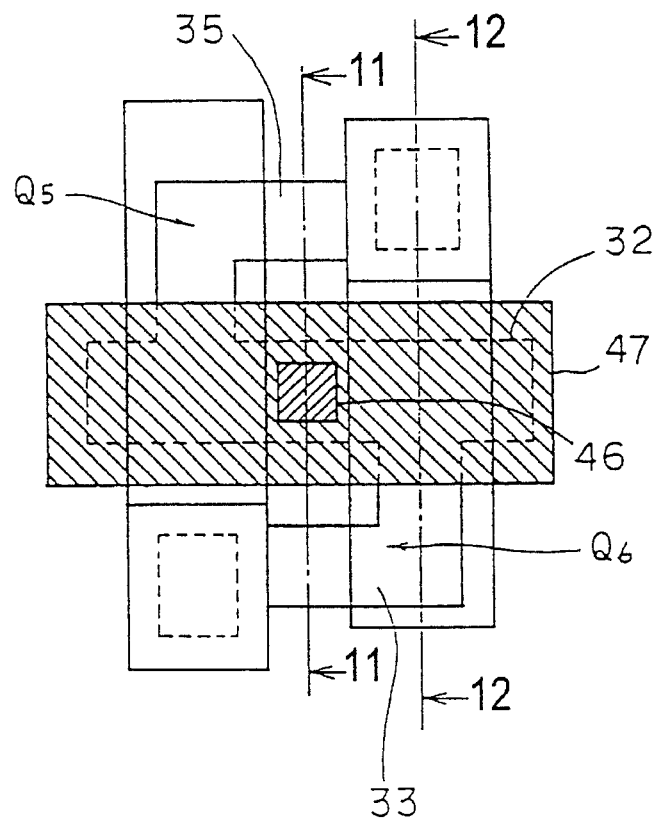
FIG. 10 is a plan showing a memory cell of an SRAM of a third embodiment of the invention.
Figure 11:
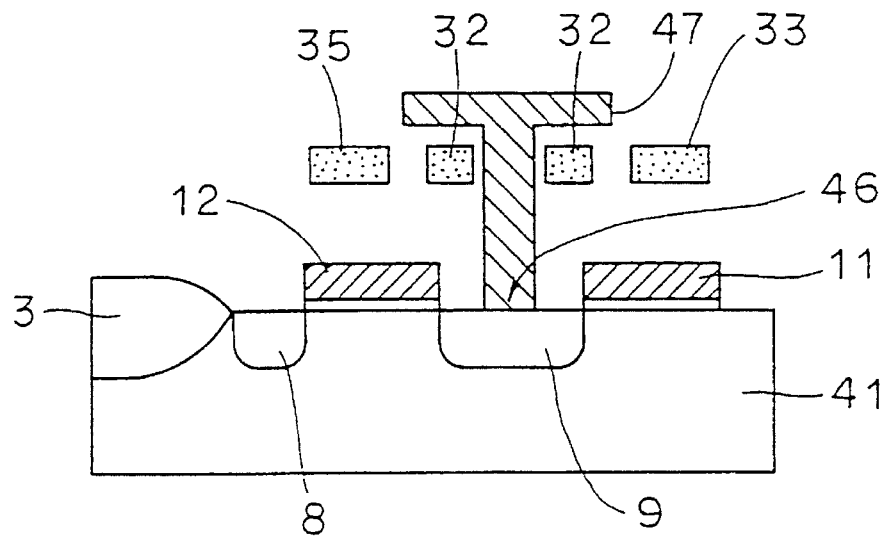
FIG. 11 is a cross section of a memory cell of a third embodiment taken along line 11—11 in FIG. 10.
Figure 12:
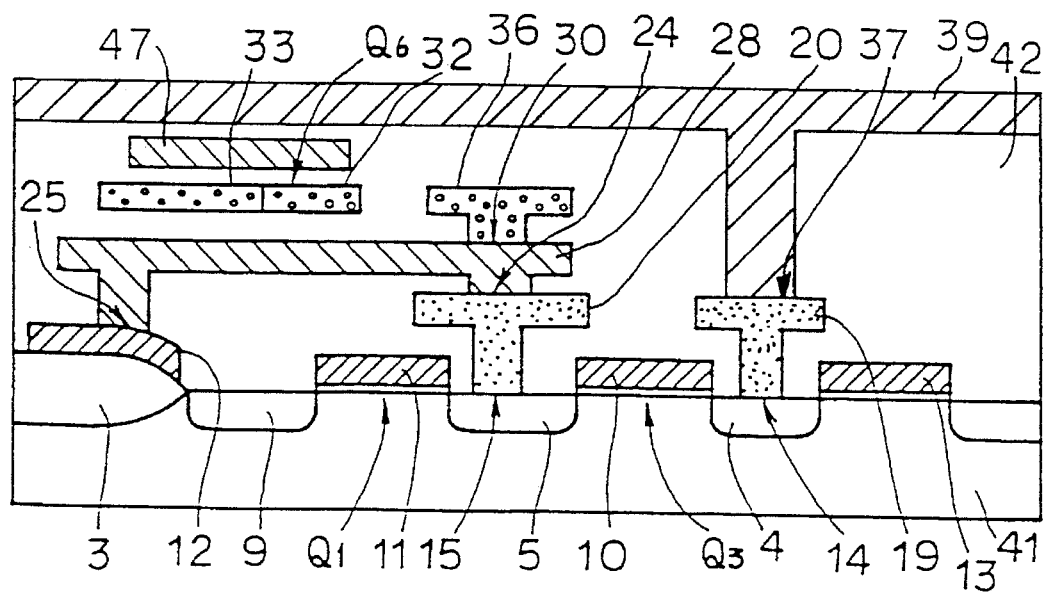
FIG. 12 is a cross section of a memory cell of a third embodiment taken along line 12—12 in FIG. 10.

FIG. 10 is a plan showing a memory cell of an SRAM of a third embodiment of the invention. The plan of FIG. 10 corresponds to the plan of FIG. 3 showing the first embodiment. FIG. 11 is a cross section of the memory cell taken along line 11—11 in FIG. 10. FIG. 12 is a cross section taken along line 12—12 in FIG. 10. Referring to FIGS. 10–12, the memory cell of the third embodiment differs from the memory cell of the first embodiment shown in FIGS. 1–16 in that an interconnection layer having an upper portion, which extends between the load transistors $Q_5$ and $Q_6$ and the bit lines 39 and 40, is electrically connected through the contact portion 46 to the source region 9. This interconnection layer 47 is formed of a metal interconnection layer or a polycide interconnection layer.

In a manufacturing method of the interconnection layer 47 of the third embodiment, after forming an opening in the fourth polysilicon layer 32, a silicon oxide film is formed on the whole surface and is subjected to anisotropic etching. Thereby, the contact portion 46 is formed. Thereafter, the interconnection layer 47, which electrically connects to the source region 9 at the contact portion 46 and extends above the fourth polysilicon layer 32, is formed.

As described above, in the third embodiment, the interconnection layer 47 is formed between the bit lines 39 and 40 and the fourth polysilicon layers 32 and 33 forming the load transistors $Q_5$ and $Q_6$, whereby a so-called "crosstalk" phenomenon, i.e., malfunction of the load transistor $Q_6$, which may be caused by the potential fluctuation of the bit line 39, can be effectively prevented. Since the interconnection layer 47 is formed after the formation of the fourth polysilicon layers 32, 33, 35 and 36, the interconnection layer 47 can be formed of the metal interconnection layer. Since the temperature rises to 800° C. or more during the formation of the polysilicon layer, it is difficult to form the metal interconnection layer having a low melting point before the formation of the polysilicon layer. However, in the third embodiment, since the interconnection layer 47 is formed after the formation of the fourth polysilicon layers 32, 33, 35 and 36, the interconnection layer 47 can be formed of the metal interconnection layer. Consequently, the metal interconnection layer having a very low resistance can be connected to the source region 9, and thus the resistance of the source region 9 can be effectively reduced.

Figure 13:
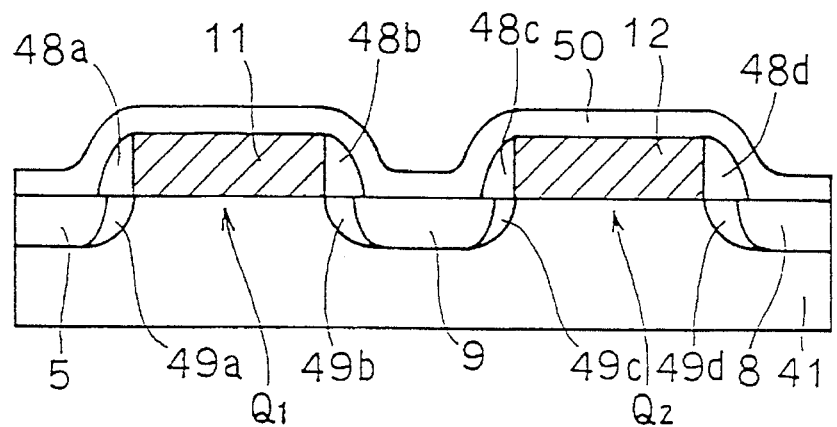
FIGS. 13–15 are cross sections showing first to third steps of a manufacturing process of a memory cell of an SRAM according to a fourth embodiment of the invention, respectively.
Figure 14:
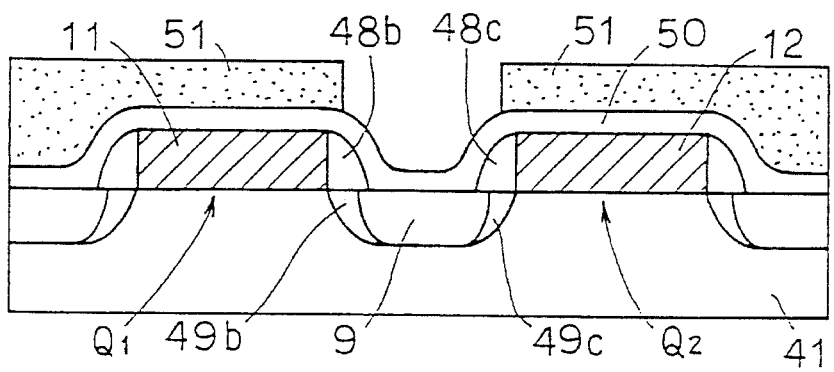
Figure 15:
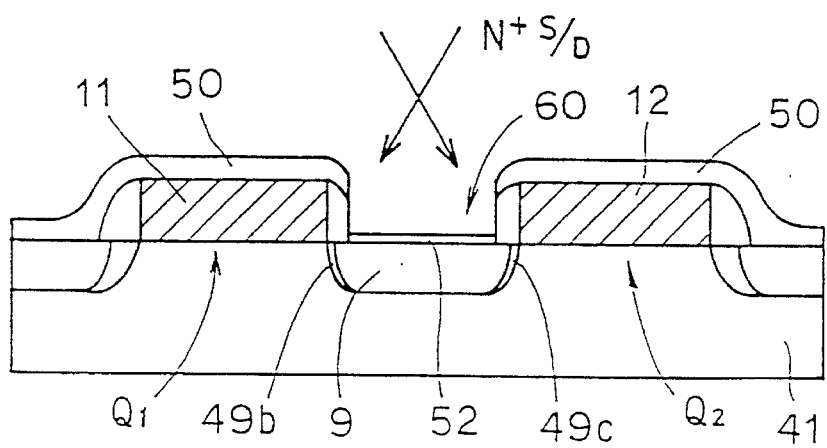

FIGS. 13–15 are cross sections showing a manufacturing process of a memory cell of a fourth embodiment of the invention. The memory cell of the fourth embodiment is provided with a titanium silicide layer 52 formed on the main surface of the source region 9, as shown in FIG. 15. Since the impurity is implanted into the source region 9 simultaneously with the formation of the titanium silicide layer 52, the resistance of the source region 9 can be effectively reduced. Referring to FIGS. 13–15, the manufacturing process of the memory cell of the fourth embodiment will be described below.

First, as shown in FIG. 13, the gate electrodes 11 and 12 of the driver transistors $Q_1$ and $Q_2$ are formed on the main surface of the P-type semiconductor substrate (P-well) 41 with a predetermined space between each other. Using the gate electrodes 11 and 12 as a mask, impurity is ion-implanted to form n⁻ source/drain regions 49a, 49b, 49c and 49d. Side walls 48a, 48b, 48c and 48d are formed on the opposite side walls of the gate electrodes 11 and 12, respectively. Using the gate electrodes 11 and 12 and side walls 48a, 48b, 48c and 48d as a mask, impurity is ion-implanted to form the drain region 5 of the driver transistor $Q_1$, the common source region 9 of the driver transistors $Q_1$ and $Q_2$, and the drain region 8 of the driver transistor $Q_2$. A silicon oxide film 50 is formed on the whole surface.

Then, as shown in FIG. 14, a resist 51 is formed on a predetermined region of the silicon oxide film 50. Using the resist 51 as a mask, anisotropic etching is effected on the silicon oxide film 50 and side walls 48b and 48c. Thereby, a contact hole 60 is formed, as shown in FIG. 15. The surface of the source region 9, which is exposed in the contact hole 60, is titanium-salified to form a titanium silicide layer 52. In this processing, an oblique ion implanting method is used to ion-implant the impurity into the source region 9. Owing to the titanium silicide layer 52 and the ion implantation, the resistance of the source region 9 can be effectively reduced. The titanium-silicification of the source region 9 generally increases a junction leak current. However, even if the junction leak current is generated, it does not cause a practical problem, because the source region 9 of the driver transistors $Q_1$ and $Q_2$ is maintained at the GND potential.

Figure 16:
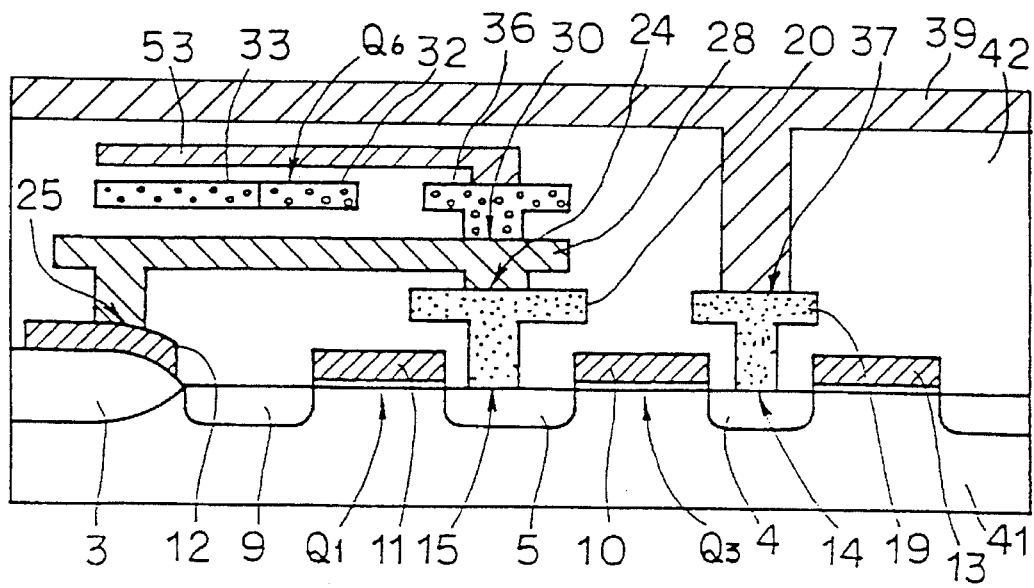
FIG. 16 is a cross section showing a memory cell of an SRAM of a fifth embodiment of the invention and corresponding to FIG. 5.
Figure 17:
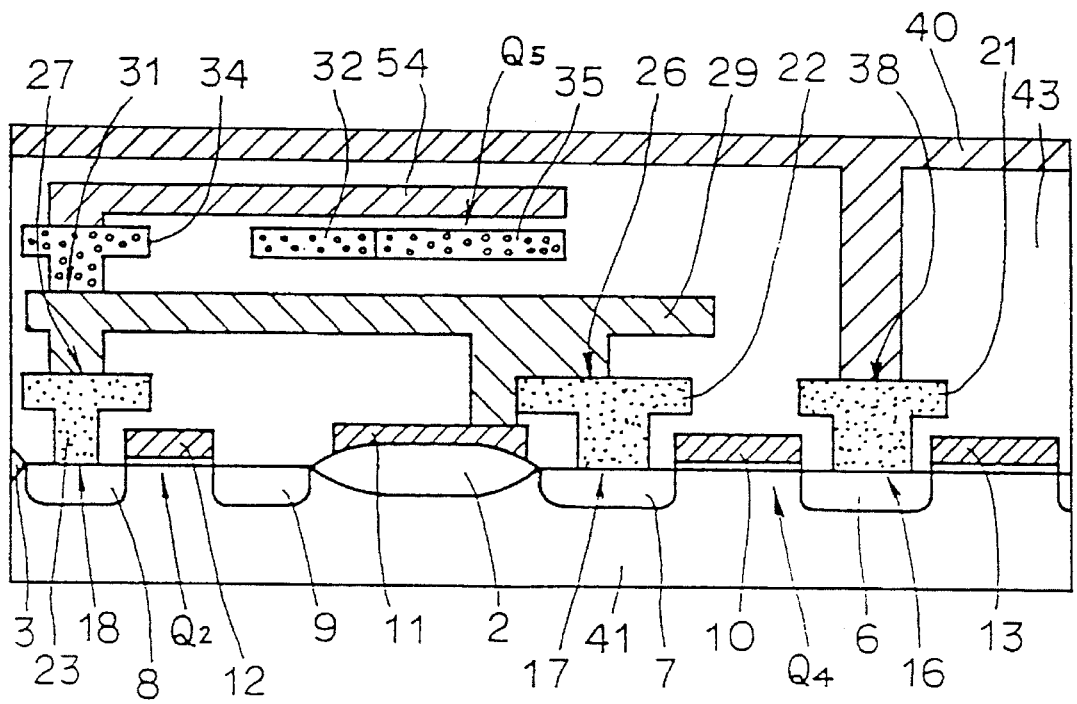
FIG. 17 is a cross section showing a memory cell of an SRAM of a fifth embodiment of the invention and corresponding to FIG. 6.

FIGS. 16 and 17 are cross sections of a memory cell of an SRAM of a fifth embodiment of the invention. FIGS. 16 and 17 correspond to FIGS. 5 and 6 showing the first embodiment, respectively. Referring to FIGS. 16 and 17, the memory cell of the fifth embodiment differs from the memory cell of the first embodiment shown in FIGS. 5 and 6 in that gate electrodes (fifth polysilicon layer) 54 and 53 forming the load transistor $Q_5$ and $Q_6$ are disposed above the channel regions 35 and 33. This structure can effectively prevent the malfunction of the load transistors $Q_6$ and $Q_5$, which may be caused by the fluctuation of the potential of bit lines 39 and 40.

Figure 18:
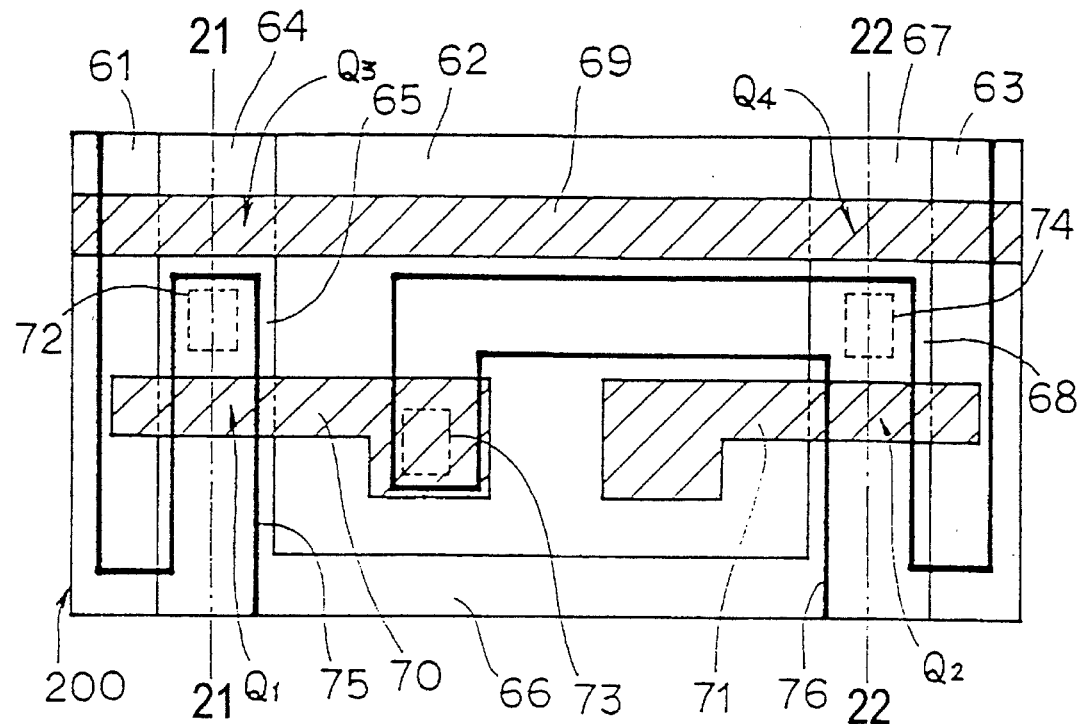
FIG. 18 is a plan view showing the structure of a first stage of memory cells in an SRAM according to a sixth embodiment of the invention.
Figure 19:
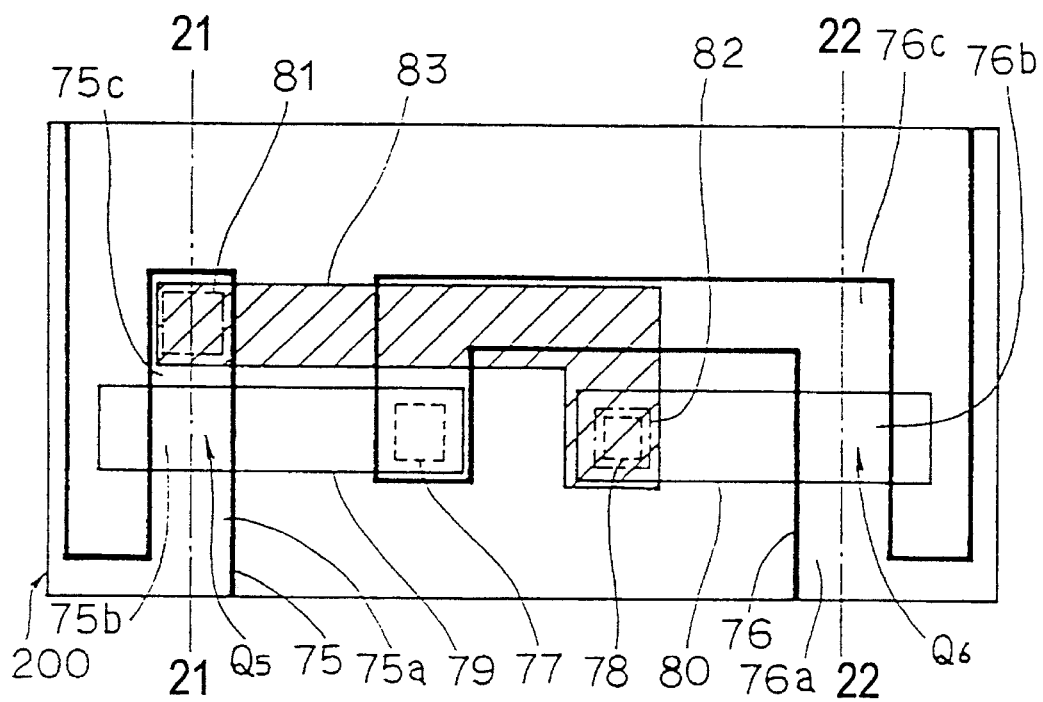
FIG. 19 is a plan view showing the structure of a second stage of memory cells in the SRAM according to the sixth embodiment of the invention.
Figure 20:
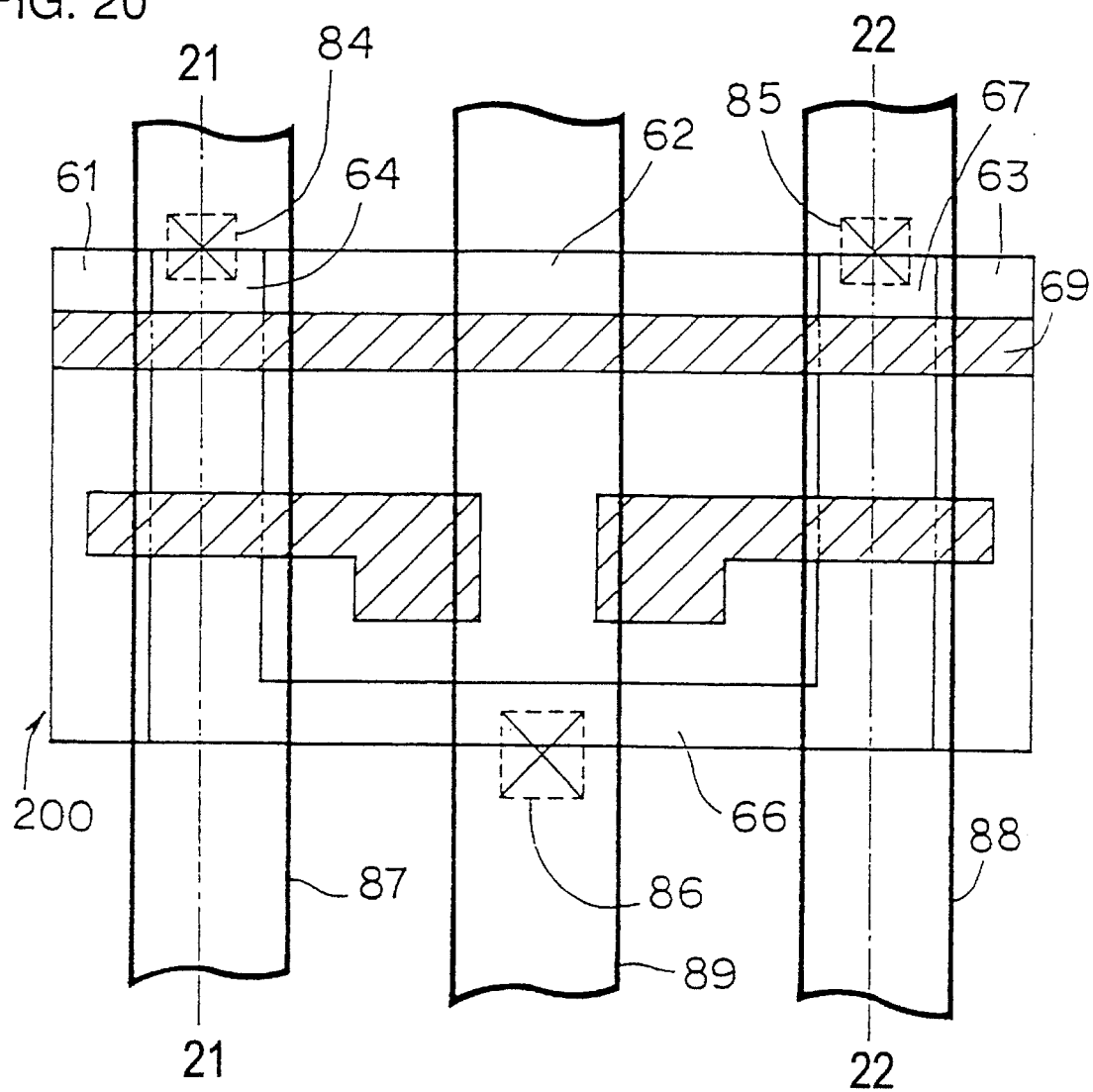
FIG. 20 is a plan view showing the structure of a third stage of memory cells in the SRAM according to the sixth embodiment of the invention.
Figure 21:
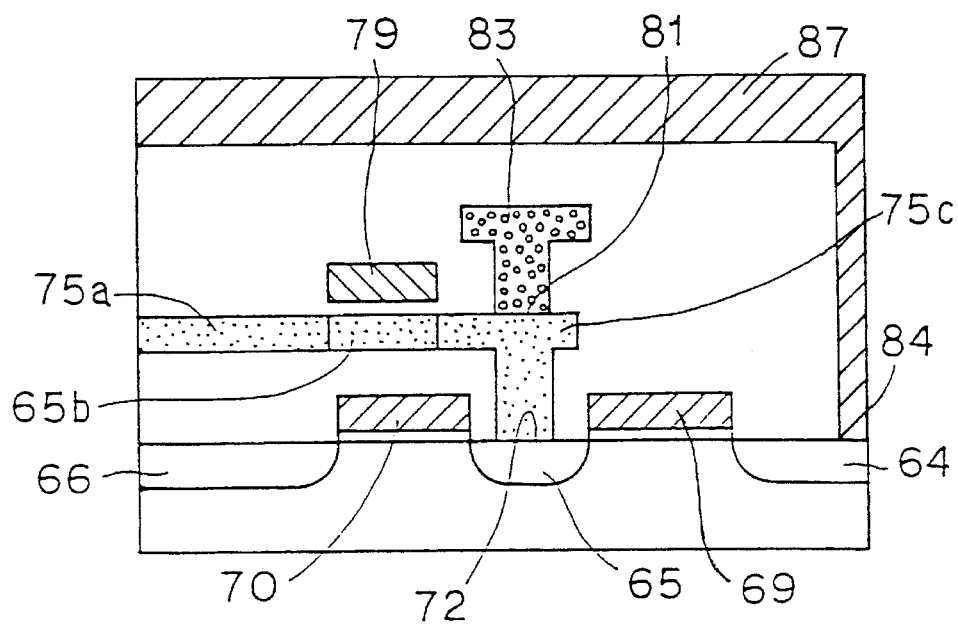
FIG. 21 is a cross sectional view showing the structure of the memory cells according to the sixth embodiment taken along line 21—21 in FIG. 18–20.

FIGS. 18–20 are plan views each showing the structure of memory cells in an SRAM according to a sixth embodiment of the invention. More specifically, FIGS. 18–20 are plan views showing three stages divided from the structure sequentially from the bottom layer of the substrate surface, respectively. FIG. 21 is a cross sectional view showing the structure taken along line 21—21 in FIGS. 18–20, and FIG. 22 is a cross sectional view taken along line 22—22 in FIGS. 18–20.

FIG. 18 shows N type impurity regions (source/drain regions) 64–68, element isolation oxide films 61–63, first polysilicon layers 69–71, first direct contact portions 72–74, and second polysilicon layers 65, 66.

More specifically, a driver transistor $Q_1$ is formed of drain region 65, gate electrode 70, and source region 66. A driver transistor $Q_2$ is formed of drain region 68, gate electrode 71, source region 66 shared with driver transistor $Q_1$.

An access transistor $Q_3$ is formed of drain region (source region) 64, gate electrode 69, and source region (drain region) 65. An access transistor $Q_4$ is formed of drain region (source region) 67, gate electrode 69, and source region (drain region) 68.

First direct contact portion 72 is for connecting second polysilicon layer 75 and N-type impurity region 65, while first direct contact portion 65 connects first polysilicon layer 76 and N type impurity region 68. First direct contact portion 73 connects second polysilicon layer 76 and first polysilicon layer 70.

FIG. 19 shows second polysilicon layers 75, 76, third polysilicon layers 79–80, a fourth polysilicon layer 83, second direct contact portions 77, 78, and third direct contact portions 81, 82.

More specifically, second direct contact portion 77 connects second polysilicon layer 76 and third polysilicon layer 79, while second direct contact portion 78 connects first polysilicon layer 71 (see FIG. 18) and third polysilicon layer 80. Third direct contact portion 81 connects second polysilicon layer 75 and fourth polysilicon layer 83. Third direct contact portion 82 connects third polysilicon layer 80 and fourth polysilicon layer 83.

A load transistor $Q_5$ is formed of p type source/drain regions (second polysilicon layer) 75a, 75c, a channel region (second polysilicon layer) 75b, and a gate electrode (third polysilicon layer) 79. A load transistor $Q_6$ is formed of p type source/drain regions (second polysilicon layer) 76a, 76c, a channel region (second polysilicon layer) 76b, and a gate electrode (third polysilicon layer) 80. According to the sixth embodiment, as opposed to the first to fifth embodiments, the gate electrodes 79 and 80 of load transistors $Q_5$ and $Q_6$ are formed over channel regions 75b and 76b, respectively.

Figure 22:
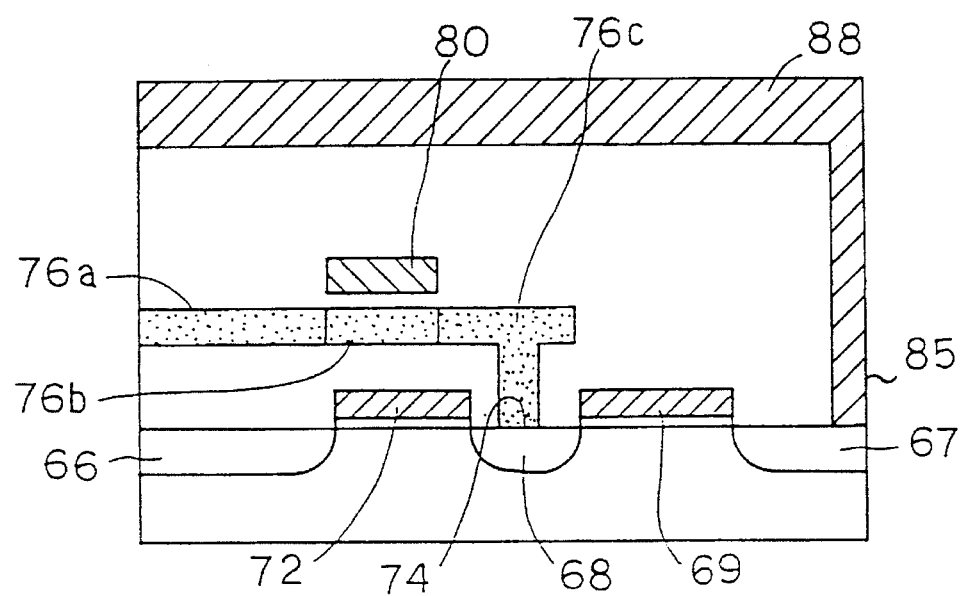
FIG. 22 is a cross sectional view showing the structure of the memory cells according to the sixth embodiment taken along line 22—22 in FIGS. 18–20.

FIG. 22 shows N type impurity regions 64–68, element isolation oxide films 61–63, first polysilicon layers 69–71, contact portions 84–86, bit lines 87, 88 formed of metal interconnections such as aluminium or tungsten, and a GND line 89 formed of metal interconnection such as aluminum or tungsten. Contact portion 84 connects N type impurity region 64 and bit line 87, while contact portion 85 connects N type impurity region 67 and bit line 88. Contact portion 86 connects a common source region (N type impurity region) 66 of driver transistors $Q_1$ and $Q_2$ and GND line 89.

According to the sixth embodiment, as in the case of the first embodiment, driver transistor $Q_1$ and driver transistor $Q_2$ share source region (N type impurity region) 66. Thus, the GND potential of driver transistor $Q_1$ is equal to that of driver transistor $Q_2$. Accordingly, imbalance in GND between driver transistor $Q_1$ and driver transistor $Q_2$ can be eliminated. Therefore, inversion of data generated based on the imbalance in the GND potentials in the conventional device can effectively be prevented.

Also according to the sixth embodiment, as opposed to the first to fifth embodiments, as illustrated in FIG. 20, bit lines 87 and 88 are arranged in the direction along the shorter side of memory cells 200. Thus, the length of the direction of the longer side of memory cells 200 determines the distance between metal interconnections formed over memory cells 200. As a result, as compared to the case in which bit lines 87 and 88 are arranged along the longer side, the distance between the metal interconnections formed over memory cells 200 can be larger. Thus, according to the sixth embodiment, not only bit lines 87 and 88 but also GND line 89 formed of metal interconnection can be arranged on memory cells 200. Therefore, in this embodiment, GND line 89 of metal interconnection having small resistance such as aluminum or tungsten can directly be connected to the common source region 66 of driver transistors $Q_1$ and $Q_2$. Thus, in this embodiment, the resistance can be reduced by the amount of the polysilicon layer as compared to the conventional structure in which the GND line and the source region of driver transistor $Q_1$ or $Q_2$ are connected through a polysilicon layer having larger resistance than a metal interconnection. Accordingly, increase in the potential of GND line 89 can effectively reduced as compared to the conventional device. Since the sixth embodiment does not need a polysilicon layer to be interposed between the GND line and the first or second driver transistor, it is not necessary to additionally provide a region for connection between the polysilicon layer and the GND line. Therefore, the integration density of elements can be further increased.

Figure 23:
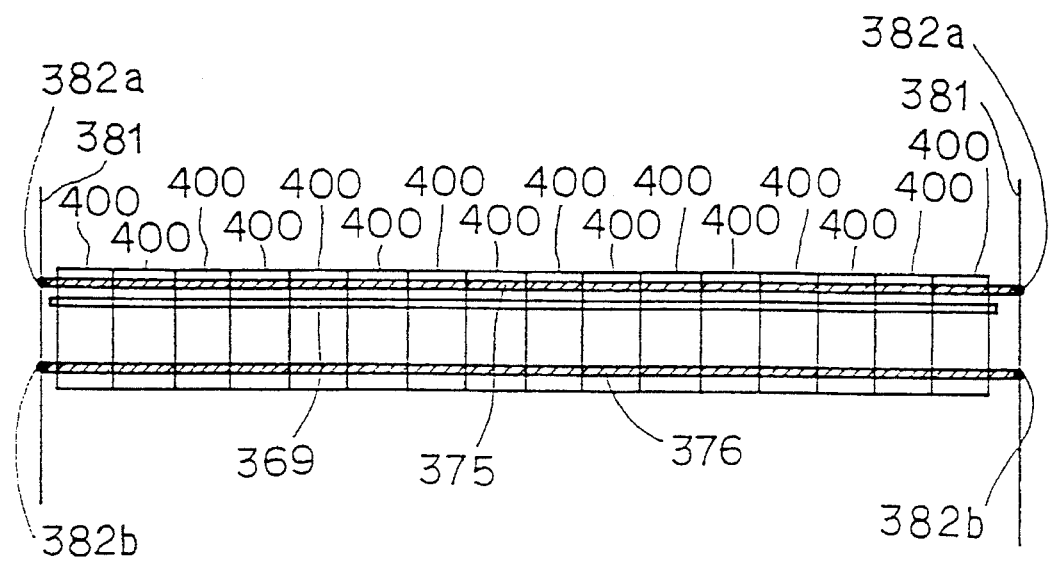
FIG. 23 is a plan view schematically showing a conventional array for 16 memory cells.
Figure 24:
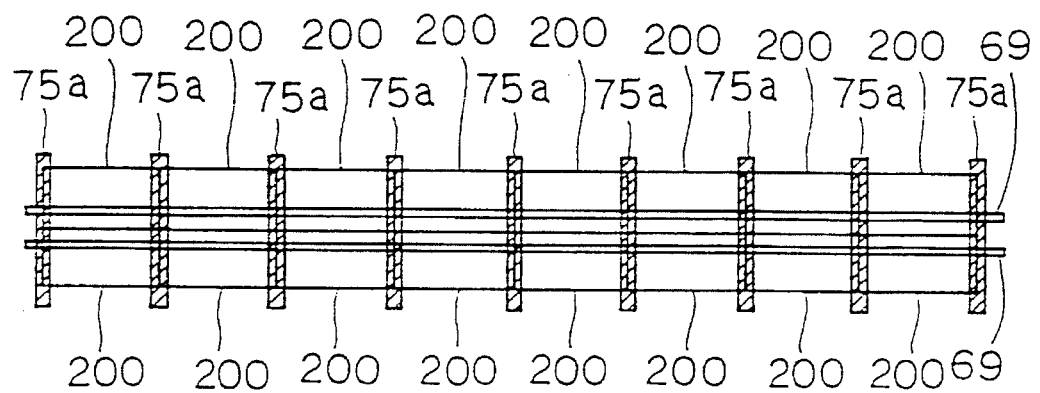
FIG. 24 is a plan view schematically showing an array for the 16 memory cells according to the sixth embodiment shown in FIGS. 18–22.
Figure 25:
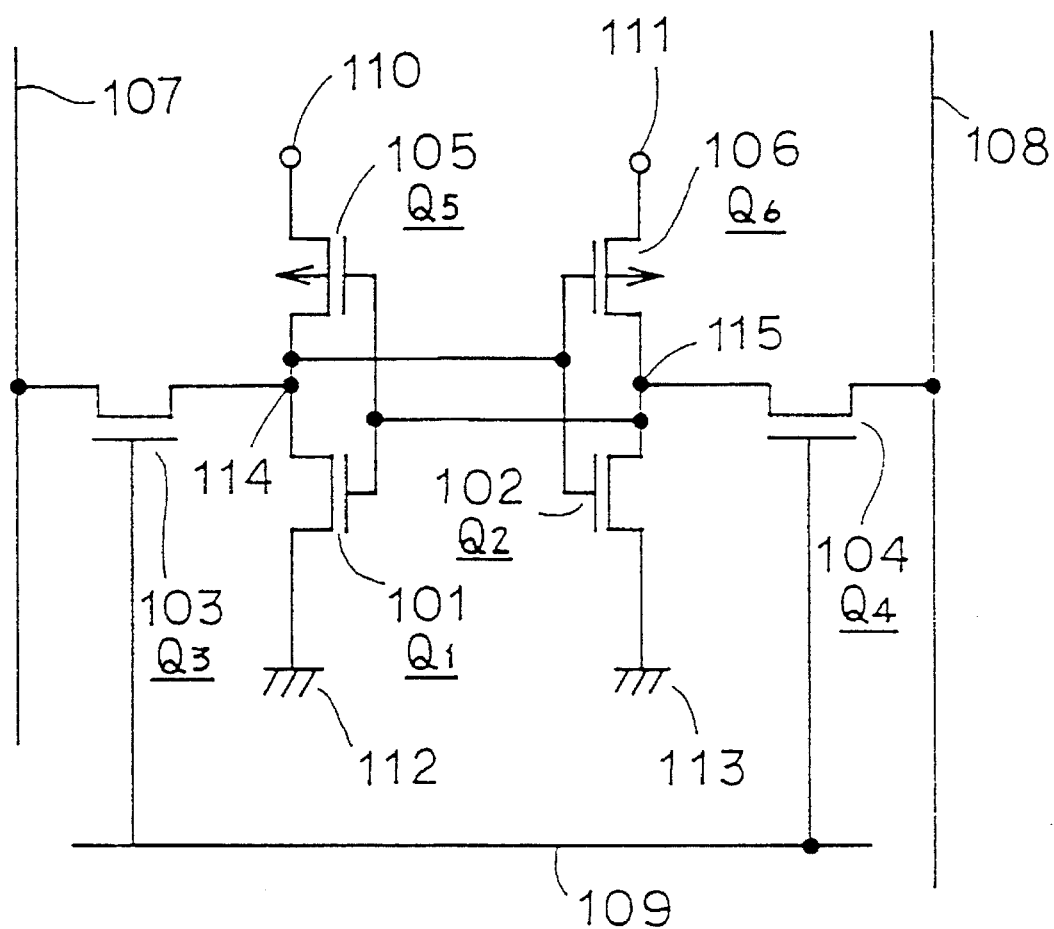
FIG. 25 is an equivalent circuit diagram of a memory cell of an SRAM in the prior art.
Figure 26:
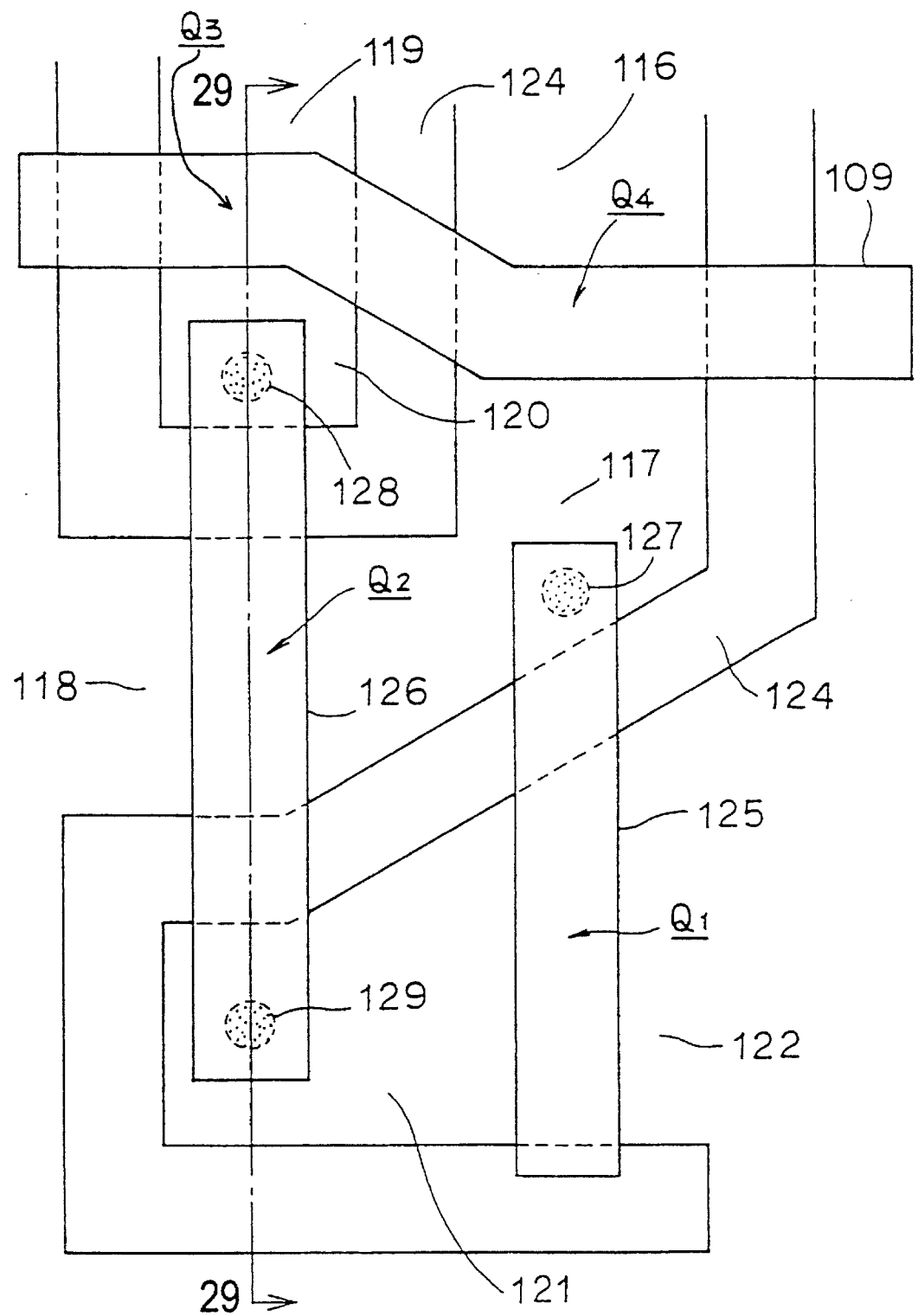
FIGS. 26–28 are plans showing structures at first to third levels of a memory cell of an SRAM in the prior art, respectively.
Figure 27:
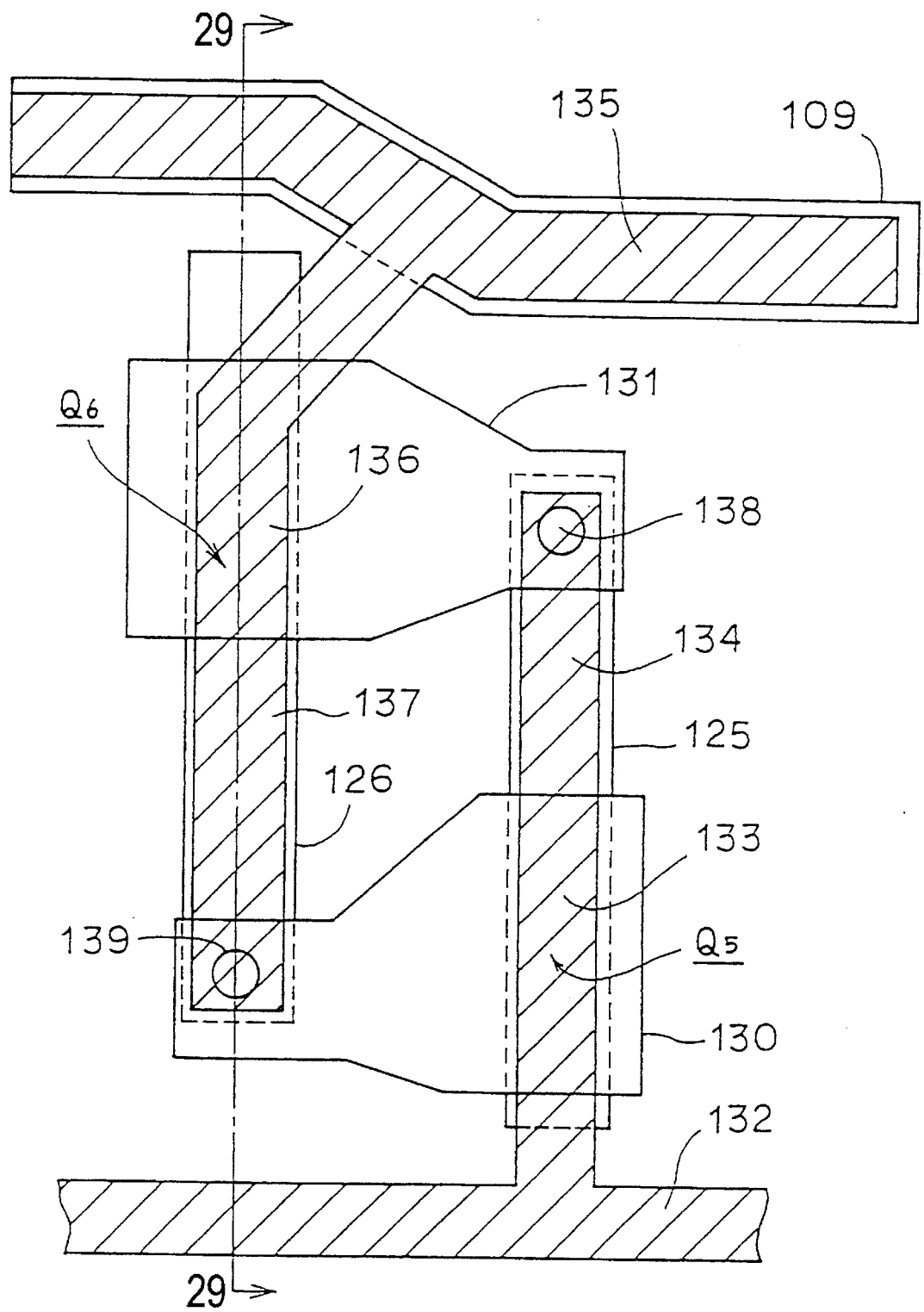
Figure 28:
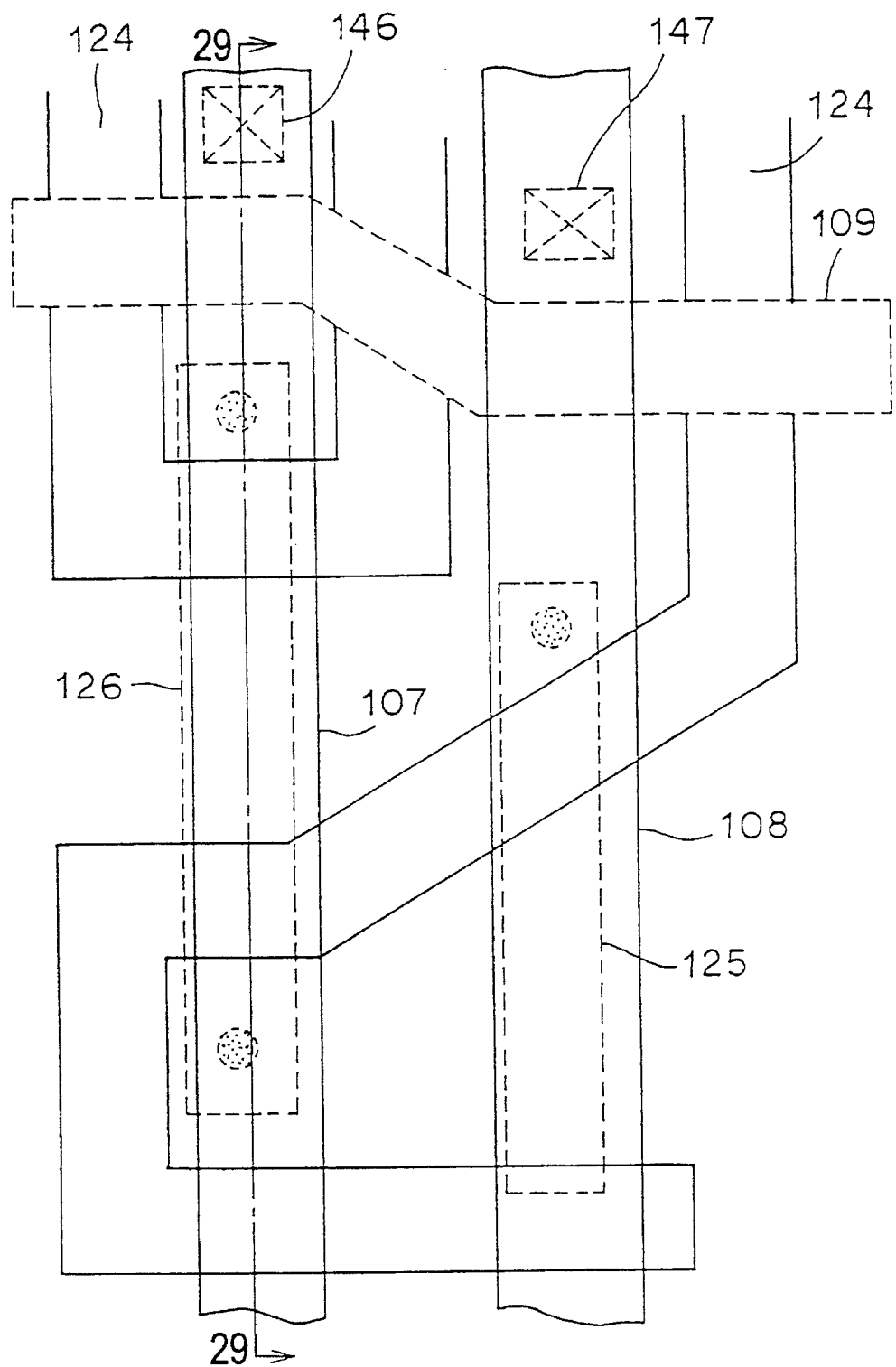
Figure 29:
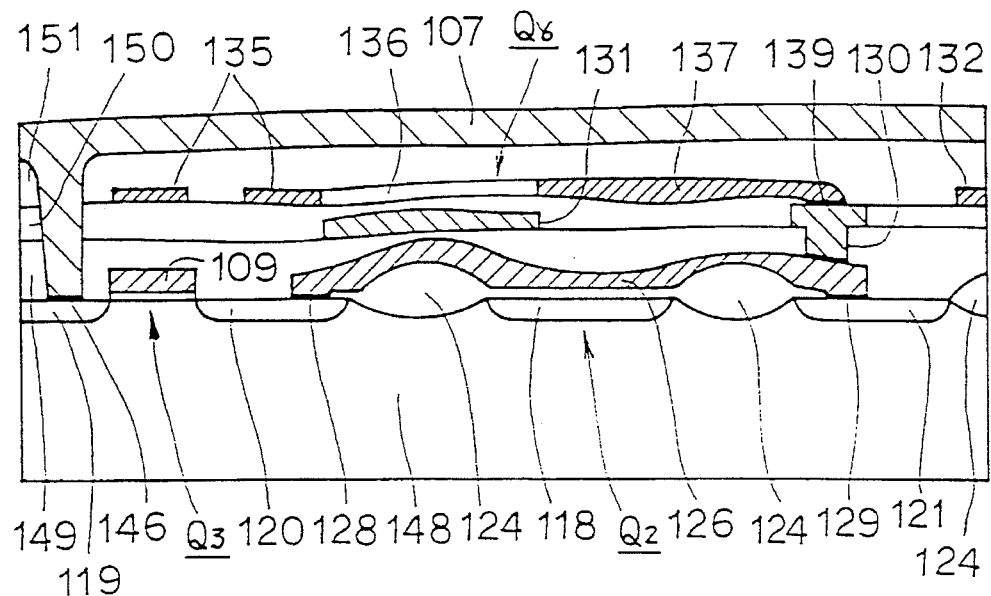
FIG. 29 is a cross section of a conventional memory cell taken along line 29—29 in FIG. 26.
Figure 30:
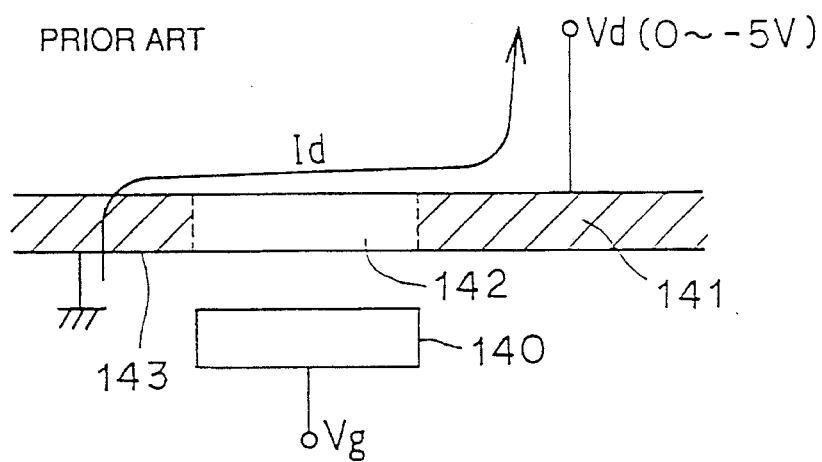
FIG. 30 is a cross section of a TFT (thin-film transistor) forming a load transistor in the prior art.
Figure 31:
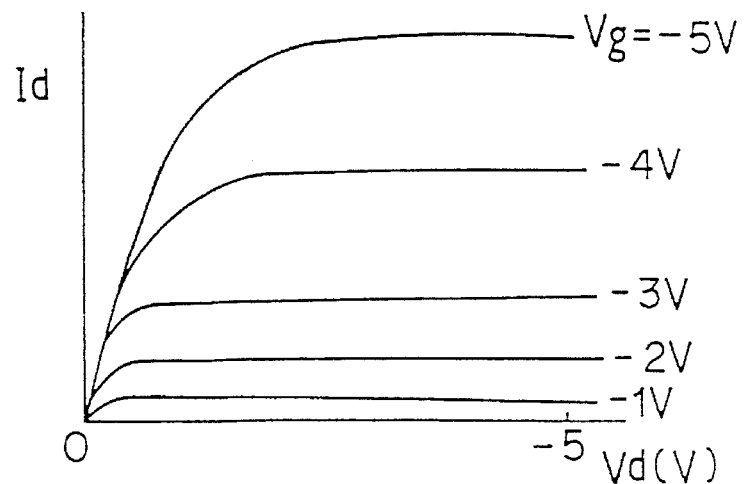
FIG. 31 is a characteristic diagram of a TFT forming a load transistor in the prior art shown in FIG. 30.
Figure 32:
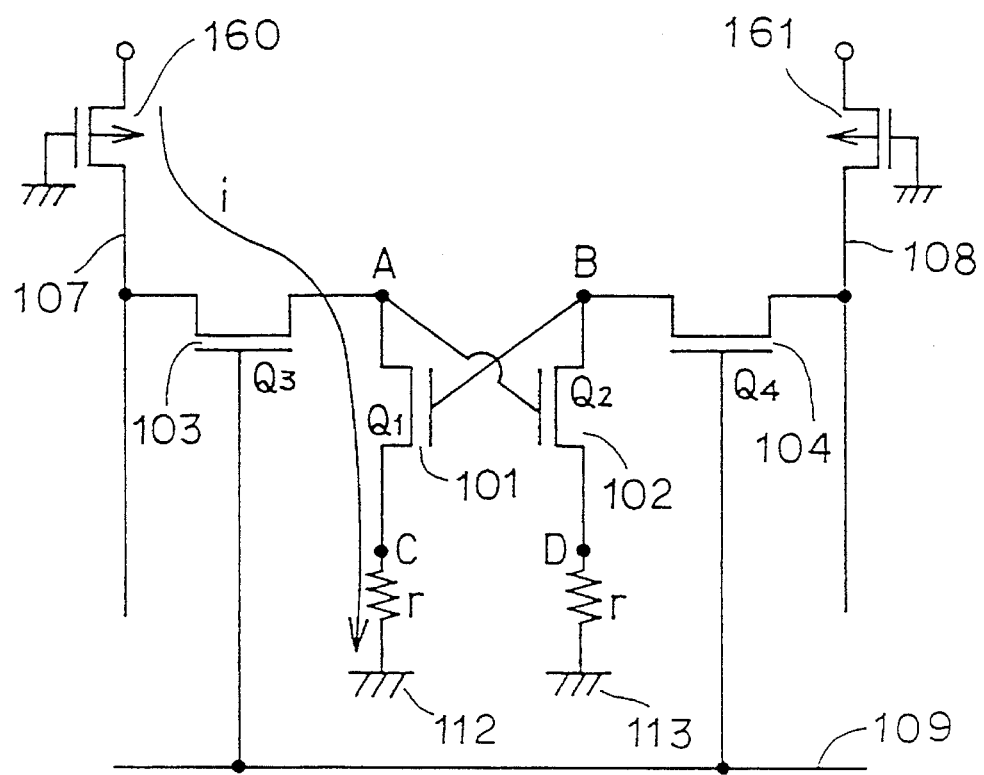
FIG. 32 is an equivalent circuit diagram showing a read operation of a memory cell of an SRAM in the prior art.
Figure 33:
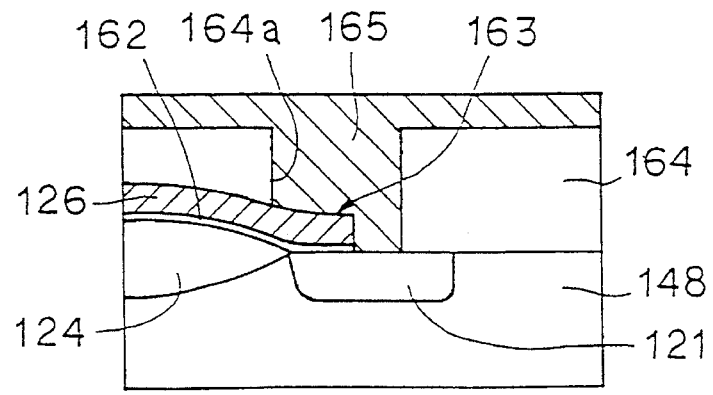
FIG. 33 is a cross section of a memory cell of a conventional SRAM which uses a shared direct contact structure for connecting a gate electrode of a driver transistor and an impurity region.

FIG. 23 is a plan view schematically showing a conventional array of 16 memory cells 400, and FIG. 24 is a plan view schematically showing an array of 16 memory cells 200 according to the sixth embodiment shown in FIGS. 18–22.

Referring to FIG. 23, conventionally, $V_{cc}$ (power supply voltage) interconnections 375 and 376 formed of polysilicon layers are arranged extending substantially parallel to word line 369. In such a structure, conventionally, word line 369 is selected and then 16 memory cells 400 are charged through $V_{cc}$ interconnections 375 and 376 of polysilicon in order to increase the potential of 16 memory cells 400 connected to word line 369 to the level of $V_{cc}$ potential. However, if such a large number of memory cells are charged at a time, it was difficult to supply the $V_{cc}$ supply voltage stably. Therefore, conventionally it was necessary to additionally provide a metal interconnection layer 381 for $V_{cc}$. Metal interconnection layer 381 for $V_{cc}$ and $V_{cc}$ interconnection 375 of polysilicon are connected at a contact portion 382a, and metal interconnection layer 381 for $V_{cc}$ and $V_{cc}$ interconnection 376 of polysilicon are connected at a contact portion 382b. These contact portions 382a and 382b must be provided in a region separate from the region in which memory cells 400 are formed.

In contrast, according to the sixth embodiment of the invention, as illustrated in FIG. 24, $V_{cc}$ interconnection 75a of polysilicon is formed substantially perpendicularly to word line 69. Therefore, word line 69 is selected, and then only two memory cells 200 should be charged by one $V_{cc}$ interconnection 75a. As a result, according to the sixth embodiment, it is not necessary to additionally provide metal interconnection layer 381 for enhancing $V_{cc}$ (see FIG. 23) as practiced in the conventional device. Accordingly, it will not be necessary to additionally provide a region for conventional contact portions 382a and 382b as illustrated in FIG. 23. Thus, the integration density of elements can further be increased. It is noted that the P-type semiconductor substrates are used in the above embodiments, but the invention is not limited thereto, and a P well on a P-type semiconductor substrate or a P well on an N-type semiconductor substrate may be used.

According to the semiconductor memory device of the invention, as described hereinabove, the source region of the first driver transistor and the source region of the second driver transistor, which are electrically connected together, are formed between the gate electrode of the first driver transistor and the gate electrode of the second driver transistor, so that the GND potential of the first driver transistor and the GND potential of the second driver transistor can be made equal to each other, and thus the imbalance between the GND potentials, which may be generated in the prior art, can be prevented. Thereby, disadvantages such as inversion of data, which may be caused, e.g., by the imbalance between the GND potentials, can be effectively prevented. In the embodiment described above, provision of the low resistance layer on the source regions of the first and second driver transistors can effectively reduce the resistance of the source regions. Also in the embodiment, the first and second load transistors are formed of the first and second thin-film transistors formed on the interlayer insulating film over the semiconductor substrate, the first and second bit lines extending above the first and second thin-film transistors are electrically connected to the first and second access transistors, respectively, and the ground interconnection layer having the upper portion, which extends between the first and second thin-film transistors and the first and second bit lines, is electrically connected to the common source region of the first and second driver transistors. Thereby, the ground interconnection layer can effectively prevent the malfunction of the first and second thin-film transistors, which may be caused by the fluctuation of potentials of the first and second bit lines.

Since a bit line and a metal interconnection layer to be a ground interconnection layer are formed a prescribed distance apart from each other and extending in the direction along the second side (shorter side) of a memory cell over the region in which the memory cells are formed, the metal interconnection layer having small resistance to be the ground interconnection layer can directly be connected to the common source region of first and second driver transistors. Thus, as compared to the conventional case in which the ground interconnection layer and the source regions of the first and second driver transistors are connected through a polysilicon layer having larger resistance than a metal interconnection layer, the resistance of the entire ground interconnection layer can be reduced by the amount of the polysilicon layer. As a result, increase in the GND potential by the conventional polysilicon layer having large resistance can be prevented, and the GND potential can easily be stabilized.

According to the semiconductor memory device of another aspect of the invention, the first conductive layer, which is electrically connected to the impurity region formed on the main surface of the semiconductor substrate, extends on the gate electrode of the driver transistor, which is formed on the element isolating and insulating film, with the insulating film therebetween, and the second conductive layer, which electrically connects the first conductive layer to the gate electrode, is formed on the first conductive layer and the gate electrode. Thereby, the contact region between the first conductive layer and the impurity region can be formed independently from the position of the end of the gate electrode. Therefore, even if the position of the end of the gate electrode deviates and is located on the element isolating and insulating film, the element isolating and insulating film is not shaved by the etching processing when forming the contact hole for the first conductive layer and the impurity region. Consequently, the generation of the junction leak current, which generates in the shared direct contact structure in the prior art, can be effectively prevented.

In a semiconductor memory device according to another aspect of the invention, since a power supply voltage interconnection layer is formed to extend in a direction substantially perpendicular to the direction in which word line forming the gate electrodes of first and second access transistors extend, and therefore only a reduced number of memory cells should be charged as compared to the conventional case of charging memory cells, a metal interconnection layer for power supply voltage which was necessary for charging a large number of memory cells in the conventional device will not be necessary. Accordingly, a connection region for connecting the metal interconnection layer for power supply voltage and the power supply voltage interconnection layer will not be necessary, and therefore the integration density of elements can further be increased.

According to the manufacturing method of the semiconductor memory device, there is formed the insulating film, which covers the semiconductor substrate and the gate electrodes of the first and second driver transistors, and has the opening located on the common source region of the first and second driver transistors. The metal silicide layer is formed on the surface of the source region inside the opening. Thereby, reduction of the resistance of the source region can be effectively prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a memory cell provided with a pair of first and second driver transistors of a first conductivity type and a pair of first and second load transistors of a second conductivity type forming a flip-flop circuit, and a pair of first and second access transistors, said memory cell comprising:
a gate electrode of said first driver transistor extending in a predetermined direction;
a gate electrode of said second driver transistor, extending substantially in the same direction as said gate electrode of said first driver transistor with a predetermined space therebetween; and
a word line extending substantially in the same direction as said gate electrode of said first driver transistor with a predetermined space therebetween, and forming gate electrodes of said first and second access transistors; wherein
source regions of said first and second driver transistors are formed to be electrically connected together between said gate electrodes of said first and second driver transistors, wherein said first and second load transistors include first and second thin-film transistors formed on an interlayer insulating film located over the semiconductor substrate,
said first and second access transistors are electrically connected to first and second bit lines extending above said first and second thin-film transistors, and
said source regions of said first and second driver transistors are electrically connected to a ground interconnection layer having an upper portion extending at least in part directly under said first and second bit lines and at least in part directly above said first and second thin-film transistors.

2. The semiconductor memory device according to claim 1, wherein said ground interconnection layer includes a metal interconnection layer.

3. A semiconductor memory device including a memory cell provided with a pair of first and second driver transistors of a first conductivity type and a pair of first and second load transistors of a second conductivity type forming a flip-flop circuit, and a pair of first and second access transistors, said memory cell comprising:
a word line forming gate electrodes of said first and second access transistors; and a gate electrode of said first driver transistor and a gate electrode of said second driver transistor sharing one line extending in a direction parallel to said word line; wherein
said first and second driver transistors have one common source region;
said memory cell is formed in a rectangular region formed of first sides and second sides shorter than said first side; and
first and second bit lines and a metal interconnection layer to be a ground line are formed a prescribed distance apart from each other and extending along the second side of said rectangular region, with said ground line extending between said first and second bit lines.

4. A semiconductor memory device including a pair of first and second driver transistors of first type conductivity and a pair of first and second load transistors of second type conductivity forming a flipflop circuit, comprising:
a word line forming the gate electrodes of first and second access transistors and extending in a prescribed direction; and
a power supply voltage interconnection layer extending entirely in a direction substantially perpendicular to the direction in which said word line extends; wherein, the first and second load transistors are formed of thin film transistors and the power supply voltage interconnection layer serves as a line for supplying the power to the load transistors.

5. A static random axis memory device comprising a memory cell formed in a rectangular region having first sides and second sides shorter than said first sides, with a ground line and first and second bit lines extending along the second side of said rectangular region, wherein said ground line extends between said first and second bit lines;
said device comprising a first driver transistor, a second driver transistor and a word line, and a gate electrode of said first driver transistor and a gate electrode of said second driver transistor sharing one line extending in a direction parallel to said word line.

6. A semiconductor memory device including a memory cell provided with a pair of first and second driver transistors of a first conductivity type and a pair of first and second load transistors of a second conductivity type forming a flip-flop circuit, and a pair of first and second access transistors, said memory cell comprising:
a gate electrode of said first driver transistor extending in a predetermined direction;
a gate electrode of said second driver transistor, extending substantially in the same direction as said gate electrode of said first driver transistor with a predetermined space therebetween;
a word line extending substantially in the same direction as said gate electrode of said first driver transistor with a predetermined space therebetween, and forming gate electrodes of said first and second access transistors; and
a low resistance layer formed on the substantially entire surfaces of source regions of said first and second driver transistors; wherein
source regions of said first and second driver transistors are formed to be electrically connected to each other.

7. The semiconductor memory device according to claim 6, wherein said low resistance layer includes a metal silicide layer.

* * * * *

UNITED STATES PATENT AND TRADEMARK OFFICE
CERTIFICATE OF CORRECTION

PATENT NO. : 5,596,212
DATED : January 21, 1997
INVENTOR(S) : Hirotada KURIYAMA

It is certified that error appears in the above-identified patent and that said Letters Patent is hereby corrected as shown below:

In claim 5 line 1 <u>axis</u> was inadvertently keyed in.
Claim 5 line 1 should read as follows:
"A static random <u>access</u> memory device"

Signed and Sealed this

Twenty-sixth Day of August, 1997

Attest:

BRUCE LEHMAN

Attesting Officer

Commissioner of Patents and Trademarks